(12) United States Patent
Xu et al.

(10) Patent No.: US 11,793,049 B2
(45) Date of Patent: Oct. 17, 2023

(54) DISPLAY APPARATUS AND METHOD OF MANUFACTURING THE SAME

(71) Applicant: BOE TECHNOLOGY GROUP CO., LTD., Beijing (CN)

(72) Inventors: Chuanxiang Xu, Beijing (CN); Guangcai Yuan, Beijing (CN); Shi Shu, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/859,605

(22) Filed: Jul. 7, 2022

(65) Prior Publication Data

US 2022/0344407 A1    Oct. 27, 2022

Related U.S. Application Data

(63) Continuation of application No. 16/624,046, filed as application No. PCT/CN2019/085702 on May 6, 2019, now Pat. No. 11,444,133.

(30) Foreign Application Priority Data

May 9, 2018   (CN) .......................... 201810438540.6

(51) Int. Cl.
*H10K 59/38*   (2023.01)
*H10K 50/86*   (2023.01)
(Continued)

(52) U.S. Cl.
CPC ........... *H10K 59/38* (2023.02); *H10K 50/865* (2023.02); *H10K 59/40* (2023.02); *H10K 71/00* (2023.02)

(58) Field of Classification Search
None
See application file for complete search history.

(56) References Cited

U.S. PATENT DOCUMENTS

2010/0134426 A1   6/2010  Lee et al.
2011/0284898 A1*  11/2011 Iwasaki ................ H10K 50/844
                                            257/98
(Continued)

FOREIGN PATENT DOCUMENTS

CN   101887904 A   11/2010
CN   106876424 A    6/2017
(Continued)

OTHER PUBLICATIONS

Requirement for Restriction-Election for the U.S. Appl. No. 16/624,046 issued by the USPTO dated Dec. 11, 2020.
(Continued)

*Primary Examiner* — Vincent Wall
(74) *Attorney, Agent, or Firm* — IP & T GROUP LLP

(57) ABSTRACT

Disclosed is a display apparatus, the display apparatus includes: a base, a display layer disposed on a side of the base, and a color filter layer disposed on a display side of the display layer. The display layer includes a plurality of sub-pixels. The color filter layer includes a plurality of color resistance portions in one-to-one correspondence with the plurality of sub-pixels. A thickness of any color resistance portion of the plurality of color resistance portions is decreased in a direction away from a reference line of the color resistance portion, and the reference line is a straight line passing through a geometric center of the color resistance portion and perpendicular to the base.

16 Claims, 12 Drawing Sheets

(51) Int. Cl.
*H10K 59/40* (2023.01)
*H10K 71/00* (2023.01)

(56) References Cited

U.S. PATENT DOCUMENTS

| | | | |
|---|---|---|---|
| 2014/0027725 A1* | 1/2014 | Lim | H10K 50/865 257/40 |
| 2015/0084026 A1* | 3/2015 | Miyamoto | H10K 50/858 257/40 |
| 2016/0300889 A1* | 10/2016 | Kim | H10K 71/00 |
| 2016/0315123 A1* | 10/2016 | Kim | H10K 59/126 |
| 2016/0322428 A1* | 11/2016 | Kim | H10K 59/38 |
| 2016/0322444 A1* | 11/2016 | Kang | H10K 50/865 |
| 2017/0170245 A1 | 6/2017 | Lin | |
| 2017/0213872 A1* | 7/2017 | Jinbo | H10K 50/865 |
| 2018/0321764 A1 | 11/2018 | Oh | |
| 2019/0074339 A1* | 3/2019 | Ma | H10K 59/40 |
| 2019/0148459 A1 | 5/2019 | He et al. | |
| 2019/0165327 A1 | 5/2019 | Ye | |
| 2020/0119113 A1* | 4/2020 | Lee | H10K 50/8445 |
| 2020/0194504 A1 | 6/2020 | Xu et al. | |

FOREIGN PATENT DOCUMENTS

| | | |
|---|---|---|
| CN | 107845668 A | 3/2018 |
| CN | 107919380 A | 4/2018 |
| CN | 108417612 A | 8/2018 |

OTHER PUBLICATIONS

The First Office Action for the U.S. Appl. No. 16/624,046 issued by the USPTO dated Mar. 4, 2021.
The Second Office Action for the U.S. Appl. No. 16/624,046 issued by the USPTO dated Nov. 30, 2021.
The Final Office Action for the U.S. Appl. No. 16/624,046 issued by the USPTO dated Aug. 3, 2021.
Notice of Allowance for the U.S. Appl. No. 16/624,046 issued by the USPTO dated May 6, 2022.
Corrected Notice of Allowance for the U.S. Appl. No. 16/624,046 issued by the USPTO dated May 18, 2022.
International Search Report and Written Opinion for the International Application No. PCT/CN2019/085702 issued by the Chinese Patent Office dated Aug. 8, 2019.

* cited by examiner

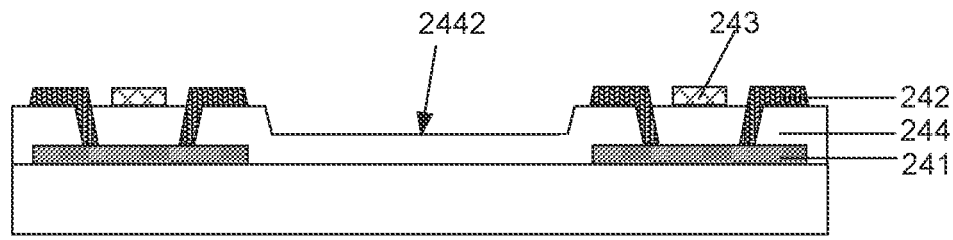

FIG. 21b

```
the first touch electrodes and the second touch
electrodes are formed in the same layer, and then the       — S621
insulating film and the bridges are sequentially formed
                            │
                            ▼
the insulating film is etched through the exposure
process, the development process, and the etching           — S622
process to form the second insulating layer provided with
the plurality of second grooves
```

FIG. 22

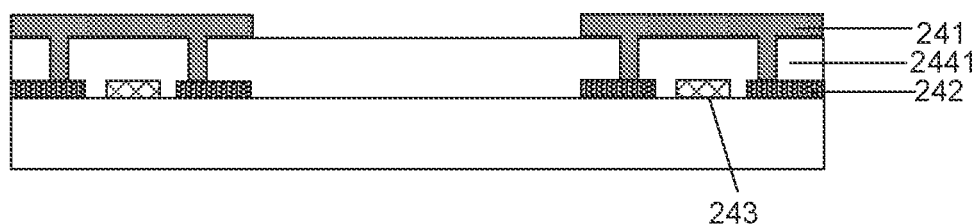

FIG. 23a

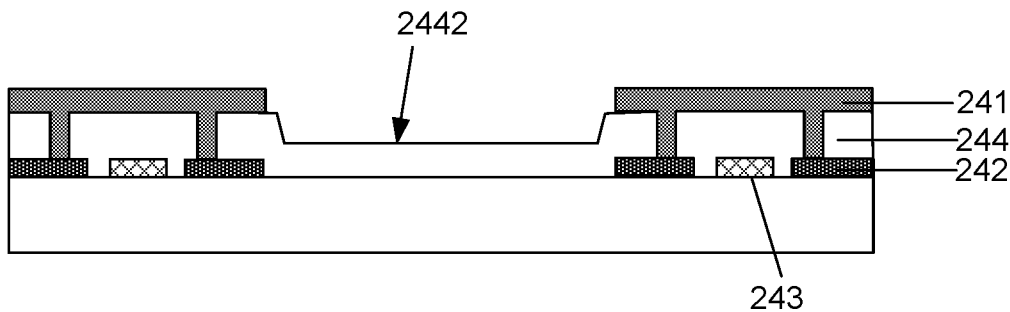

FIG. 23b

```
the bridges, the insulating film, and the first touch
electrodes and the second touch electrodes that are     — S61
disposed in the same layer are sequentially formed
```

↓

```
the first touch electrodes and the second touch
electrodes are used as a mask to etch the surface of the
insulating film away from the bridges to form the second  — S62
insulating layer provided with the second grooves and
the third grooves
```

FIG. 24

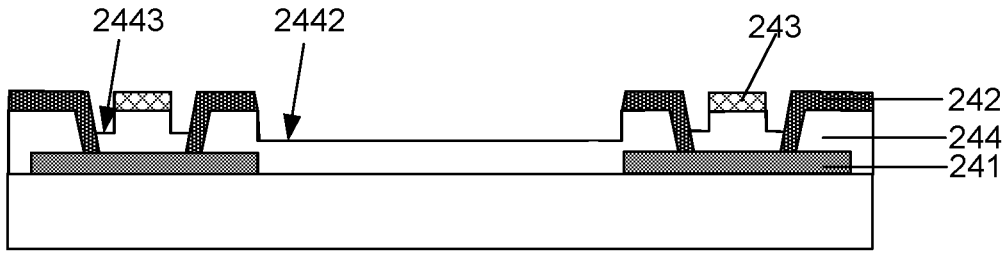

FIG. 25

```
The black matrix having the plurality of openings is formed, and the
plurality of color resistance portions are in one-to-one                — S5
correspondence with the plurality of openings
```

↓

```
Before the first insulating layer is formed, the touch structure layer is
formed on the side of the first insulating layer away from the color
filter layer, and an orthographic projection of the touch structure layer  — S6
on the display layer is located within the range of the orthographic
projection of the black matrix on the display layer
```

FIG. 26

DISPLAY APPARATUS AND METHOD OF MANUFACTURING THE SAME

CROSS-REFERENCE TO RELATED APPLICATIONS

The present application a Continuation Application of U.S. patent application Ser. No. 16/624,046 filed Dec. 18, 2019, which is a national phase entry under 35 USC 371 of International Patent Application No. PCT/CN2019/085702 filed on May 6, 2019, which claims priority to Chinese Patent Application No. 201810438540.6, filed with the Chinese Patent Office on May 9, 2018, which are incorporated herein by reference in their entirety.

TECHNICAL FIELD

The present disclosure relates to the field of display technologies, and in particular, to a display apparatus and a method of manufacturing the same.

BACKGROUND

With the development of display technologies, display apparatuses have been widely used in people's daily life. The display apparatuses generally include cathode ray tube (CRT) display apparatuses, liquid crystal display apparatuses, organic light-emitting diode (OLED) display apparatuses, quantum dots light-emitting diode (QLED) display apparatuses and the like.

SUMMARY

In one aspect, some embodiments of the present disclosure provide a display apparatus. The display apparatus includes: a base, a display layer disposed on a side of the base, a color filter layer disposed on a display side of the display layer, a first insulating layer, a touch structure layer disposed on a side of the first insulating layer away from the color filter layer and a black matrix provided with a plurality of openings. The display layer includes a plurality of sub-pixels. The color filter layer includes a plurality of color resistance portions in one-to-one correspondence with the plurality of sub-pixels. A thickness of any color resistance portion of the plurality of color resistance portions is decreased in a direction away from a reference line of the color resistance portion, and the reference line is a straight line passing through a geometric center of the color resistance portion and perpendicular to the base.

A surface of the first insulating layer adjacent to the color filter layer is provided with a plurality of first grooves in one-to-one correspondence with the plurality of color resistance portions. A depth of any first groove is decreased in a direction away from a reference line of a corresponding color resistance portion. An orthographic projection of each color resistance portion on the display layer is located within a range of an orthographic projection of a corresponding first groove on the display layer. A surface of each first groove adjacent to the color filter layer is in contact with a surface of a corresponding color resistance portion adjacent to the first insulating layer. The plurality of color resistance portions are in one-to-one correspondence with the plurality of openings. The touch structure layer includes a plurality of electrodes and a second insulating layer. Orthographic projections of the plurality of electrodes of the touch structure layer on the display layer are located within a range of an orthographic projection of the black matrix on the display layer.

The plurality of electrodes include first touch electrodes, second touch electrodes, and bridges, the first touch electrodes and the second touch electrodes are insulated from each other and arranged crosswise. Each first touch electrode includes a plurality of first touch sub-electrodes separated by the second touch electrodes, and two adjacent first touch sub-electrodes in the first touch electrode are electrically connected through a bridge. The bridges and the second touch electrodes are separated by the second insulating layer. A surface of the second insulating layer adjacent to the first insulating layer is provided with a plurality of second grooves, and the plurality of second grooves and the plurality of first grooves are in one-to-one correspondence. An orthographic projection of each first groove on the display layer is located within a range of an orthographic projection of a corresponding second groove on the display layer. A surface of each second groove adjacent to the first insulating layer is in direct contact with a surface of the first insulating layer adjacent to the second insulating layer.

The touch structure layer and the first insulating layer form a first combined structure, and the touch structure layer, the first insulating layer and the color filter layer form a second combined structure. A difference of a maximum thickness of a portion of the first combined structure whose orthographic projection on the base is located between the orthographic projections of the sub-pixels on the base, and a minimum thickness of a portion of the first combined structure whose orthographic projection on the base overlaps with an orthographic projection of a sub-pixel on the base is $\Delta H2$. A difference of a maximum thickness of a portion of the second combined structure whose orthographic projection on the base is located between the orthographic projections of the sub-pixels on the base, and a minimum thickness of a portion of the second combined structure whose orthographic projection on the base overlaps with an orthographic projection of a sub-pixel on the base is $\Delta H3$. $\Delta H3$ is less than $\Delta H2$.

In some embodiments, a difference of a maximum thickness of a portion of the touch structure layer whose orthographic projection on the base is located between the orthographic projections of the sub-pixels on the base, and a minimum thickness of a portion of the touch structure layer whose orthographic projection on the base overlaps with an orthographic projections of a sub-pixel on the base is $\Delta H1$; $\Delta H2$ is less than $\Delta H1$.

In some embodiments, the thickness of any color resistance portion is stepwise changed.

In some embodiments, an edge of an orthographic projection of each color resistance portion on the base is located outside an edge of an orthographic projection of a corresponding opening on the base.

In some embodiments, an orthographic projection of each sub-pixel on the base is located within a range of an orthographic projection of a corresponding color resistance portion on the base.

In some embodiments, an edge of the orthographic projection of each sub-pixel on the base is located inside the edge of the orthographic projection of the corresponding opening on the base.

In some embodiments, a surface of the color filter layer away from the first insulating layer is flatter than a surface of the color filter layer adjacent to the first insulating layer.

In some embodiments, a surface of the first insulating layer away from the second insulating layer is flatter than the surface of the first insulating layer adjacent to the second insulating layer.

In some embodiments, a thickness of the color filter layer is in a range of 2 μm to 10 μm.

In some embodiments, the first touch electrodes and the second touch electrodes are disposed on a side of the bridges proximate to the first insulating layer. The surface of the second insulating layer adjacent to the first insulating layer is further provided with a plurality of third grooves, and an orthographic projection of each third groove on the display layer is located between an orthographic projection of a corresponding first touch sub-electrode on the display layer and an orthographic projection of a second touch electrode adjacent to the corresponding first touch sub-electrode on the display layer.

In some embodiments, the first insulating layer and the second insulating layer each include an organic insulating layer.

In some embodiments, a material of the touch structure layer is metal.

In some embodiments, the first touch electrodes and the second touch electrodes are disposed in a same layer.

In another aspect, some embodiments of the present disclosure provide a method of manufacturing a display apparatus. The method includes: providing a base; forming a display layer on a side of the base; and forming a color filter layer on a display side of the display layer. The display layer includes a plurality of sub-pixels. The color filter layer includes a plurality of color resistance portions in one-to-one correspondence with the plurality of sub-pixels. A thickness of any color resistance portion is decreased in a direction away from a reference line of the color resistance portion, and the reference line is a straight line passing through a geometric center of the color resistance portion and perpendicular to the base.

Before the color filter layer is formed, the method of manufacturing the display apparatus further includes: forming a first insulating layer. A surface of the first insulating layer adjacent to the color filter layer is provided with a plurality of first grooves in one-to-one correspondence with the plurality of color resistance portions. A depth of any first groove is decreased in a direction away from a reference line of a corresponding color resistance portion. An orthographic projection of each color resistance portion on the display layer is located within a range of an orthographic projection of a corresponding first groove on the display layer. A surface of each first groove adjacent to the color filter layer is in contact with a surface of the corresponding color resistance portion adjacent to the first insulating layer.

Forming a black matrix provided with a plurality of openings, wherein the plurality of color resistance portions are in one-to-one correspondence with the plurality of openings; and forming a touch structure layer before forming the first insulating layer, wherein the touch structure layer includes a plurality of electrodes, and orthographic projections of the plurality of electrodes of the touch structure layer on the display layer are located within a range of an orthographic projection of the black matrix on the display layer.

Forming the touch structure layer, includes: forming a second insulating layer, bridges, first touch electrodes, and second touch electrodes. The first touch electrodes and the second touch electrodes are insulated from each other and are arranged crosswise. Each first touch electrode includes a plurality of first touch sub-electrodes separated by the second touch electrodes. Two adjacent first touch sub-electrodes in the first touch electrode are electrically connected through a bridge.

Bridges and the second touch electrodes are separated by the second insulating layer. A surface of the second insulating layer adjacent to the first insulating layer is provided with a plurality of second grooves. The plurality of second grooves are in one-to-one correspondence with the plurality of first grooves, and an orthographic projection of each first groove on the display layer is located within a range of an orthographic projection of a corresponding second groove on the display layer. A surface of each second groove adjacent to the first insulating layer is in direct contact with a surface of the first insulating layer adjacent to the second insulating layer.

The touch structure layer and the first insulating layer form a first combined structure, and the touch structure layer, the first insulating layer and the color filter layer form a second combined structure. A difference of a maximum thickness of a portion of the first combined structure whose orthographic projection on the base is located between the orthographic projections of the sub-pixels on the base, and a minimum thickness of a portion of the first combined structure whose orthographic projection on the base overlaps with an orthographic projection of a sub-pixel on the base is ΔH2. A difference of a maximum thickness of a portion of the second combined structure whose orthographic projection on the base is located between the orthographic projections of the sub-pixels on the base, and a minimum thickness of a portion of the second combined structure whose orthographic projection on the base overlaps with an orthographic projection of a sub-pixel on the base is ΔH3. ΔH3 is less than ΔH2.

In some embodiments, forming the first insulating layer includes: forming a photosensitive film; exposing, by using a gray scale mask method, any region of a plurality of regions of the photosensitive film where the first grooves are to be formed at different exposure doses, and developing the exposed regions to form the first insulating layer.

In some embodiments, forming the second insulating layer, the bridges, the first touch electrodes, and the second touch electrodes, includes: sequentially forming the bridges, an insulating film, and the first touch electrodes and the second touch electrodes that are disposed in a same layer; and etching a surface of the insulating film away from the bridges by using the first touch electrodes and the second touch electrodes as a mask to form the second insulating layer having the plurality of second grooves and a plurality of third grooves. An orthographic projection of each third groove on the display layer is located between an orthographic projection of a corresponding first touch sub-electrode on the display layer and an orthographic projection of a second touch electrode adjacent to the corresponding first touch sub-electrode on the display layer.

BRIEF DESCRIPTION OF THE DRAWINGS

In order to describe technical solutions in some embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art may obtain other drawings according to these drawings without paying any creative effort.

FIG. 21a and FIG. 21b are schematic diagrams showing the process of manufacturing the touch structure layer shown in FIG. 20;

FIG. 22 is another flow diagram of manufacturing the touch structure layer according to some embodiments of the present disclosure;

FIG. 23a and FIG. 23b are schematic diagrams showing the process of manufacturing the touch structure layer shown in FIG. 22;

FIG. 24 is yet another flow diagram of manufacturing the touch structure layer, according to some embodiments of the present disclosure; and FIG. 25 is a schematic diagram showing the process of manufacturing the touch structure layer shown in FIG. 24.

FIG. 26 is a flow diagram of yet another method of manufacturing a display apparatus, according to some embodiments of the present disclosure.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of some embodiments of the present disclosure by a person of ordinary skill in the art without paying any creative effort shall be included in the protection scope of the present disclosure.

In some embodiments of the present disclosure, the term "a plurality of" means two or more unless otherwise specified. Terms "first" and "second" are used to distinguish between same or similar items whose functions and effects are substantially the same. A person skilled in the art will understand that the terms "first" and "second" are not intended to limit a quantity and an order of execution of the items, and do not limit a difference among the items.

A display apparatus generally includes a plurality of metal layers (for example, a reflective electrode in a liquid crystal display apparatus, a cathode of a light-emitting device in an organic light-emitting diode (OLED) display apparatus, and a reflective anode in a top light-emitting OLED device). The metal layers described above each have a high reflectivity to ambient light, and reflected light will affect a display effect of the display apparatus.

In the related art, the reflected natural light is reduced by providing a circular polarizer at a side of the display apparatus where a light exit surface thereof is located. However, a thickness of the circular polarizer is generally larger, and is generally approximately 100 μm, which causes a thickness of the display apparatus provided with the circular polarizer to be larger.

Figure 1:
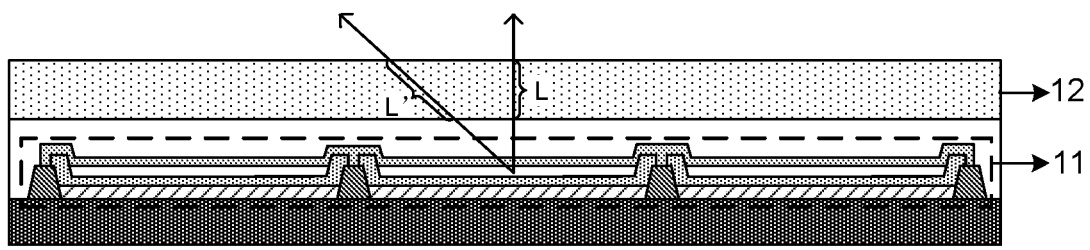
FIG. 1 is a schematic structural diagram of a display apparatus in the related art.

In addition, as shown in FIG. 1, in the related art, the reflected ambient light is reduced by providing a filter film 12 on a side of a light-emitting layer 11 proximate to a display surface. However, since exit angles of light beams emitted from the light-emitting layer 11 are different (referring to exit angles of light beams indicated by the arrows in FIG. 1), distances actually traveled by light of different exit angles in the filter film 12 are also different (referring to the distances L and L' in FIG. 1). The longer the distances actually traveled by the light in the filter film 12, the higher color purities. Therefore, when the display apparatus displays an image, a problem that color purities of images from different viewing angles are different is easy to occur.

Figure 2:
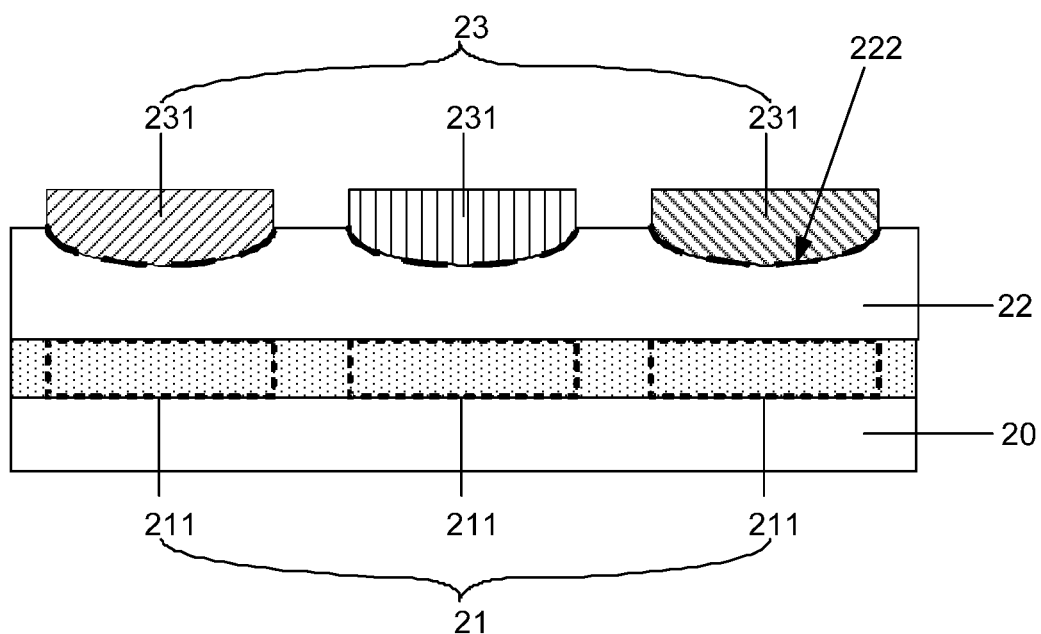
FIG. 2 is a schematic structural diagram of a display apparatus, according to some embodiments of the present disclosure.

Some embodiments of the present disclosure provide a display apparatus. As shown in FIG. 2, the display apparatus includes a base 20, a display layer 21 disposed on a side of the base 20, and a color filter layer 23 disposed on a display side of the display layer 21.

Here, the base 20 is a rigid base or a flexible base. A material of the rigid base is, for example, glass or silicon, and a material of the flexible base is, for example, a flexible organic material. When the display apparatus is used as a flexible display apparatus, a flexible base is used as the base 20 of the display apparatus. Optionally, the base 20 of the display apparatus further includes an inorganic film layer disposed on a side of the flexible base away from the display layer 21, and the inorganic film layer may be used to stabilize the flexible base.

The above display layer refers to a pixel structure layer that may achieve display, and the display layer 21 includes a plurality of sub-pixels 211 arranged in an array. For example, the display apparatus is an OLED display panel, the display layer includes an OLED array, and each sub-pixel 211 corresponds to an OLED light-emitting device. Or, the display apparatus is a liquid crystal display panel, the display layer includes common electrode(s), pixel electrodes in one-to-one correspondence with the plurality of sub-pixels, and a liquid crystal layer disposed between the common electrode(s) and a plurality of pixel electrodes.

A display surface of the display layer refers to a surface of the display layer facing a viewer when the viewer faces the display apparatus and is able to view an image displayed.

The color filter layer 23 includes a plurality of color resistance portions 231 in one-to-one correspondence with the plurality of sub-pixels 211. A thickness of any color resistance portion 231 is decreased in a direction away from a reference line of the color resistance portion 231, and the reference line is a straight line passing through a geometric center of the color resistance portion 231 and perpendicular to the base 20.

It will be noted that, the display apparatus is, for example, a display panel or a display including a display panel, and the display panel is an OLED display panel or a liquid crystal display panel. Some embodiments of the present disclosure do not limit this, as long as the display apparatus may be used for display.

In a case where the display panel is an OLED display panel, sub-pixels 211 included in the display layer 21 are defined by a pixel defining layer, and a range of the sub-pixel 211 is defined by a corresponding opening region of the pixel defining layer. In a case where the display panel is a liquid crystal display panel, the sub-pixels 211 included in the display layer 21 are defined by gate lines and data lines.

Some embodiments of the present disclosure do not limit the position of the color filter layer 23. The color filter layer 23 may be disposed inside or outside the display panel, as long as the color filter layer 23 is located at the display side of the display layer 21.

Optionally, the color filter layer 23 is disposed inside the display panel. For example, the color filter layer 23 is disposed in an array substrate of the display panel or on an opposite substrate 30 of the display panel (as shown in FIG. 13, a direction indicated by the arrow is a light exit direction of the display layer 21). The opposite substrate 30 is, for example, a substrate disposed opposite to the array substrate in the liquid crystal display panel. In a case where the color filter layer 23 is disposed in the array substrate of the display panel, depending on different display surfaces of the display panel (i.e., different light exit directions of the display layer 21), the color filter layer 23 is disposed, for example, on a side of the display layer 21 proximate to the base 20 (as shown in FIG. 12, a direction indicated by the arrow is the light exit direction of the display layer 21), or on a side of the display layer 21 away from the base 20 (as shown in FIG. 11, a direction indicated by the arrow is the light exit direction of the display layer 21).

Figure 14:
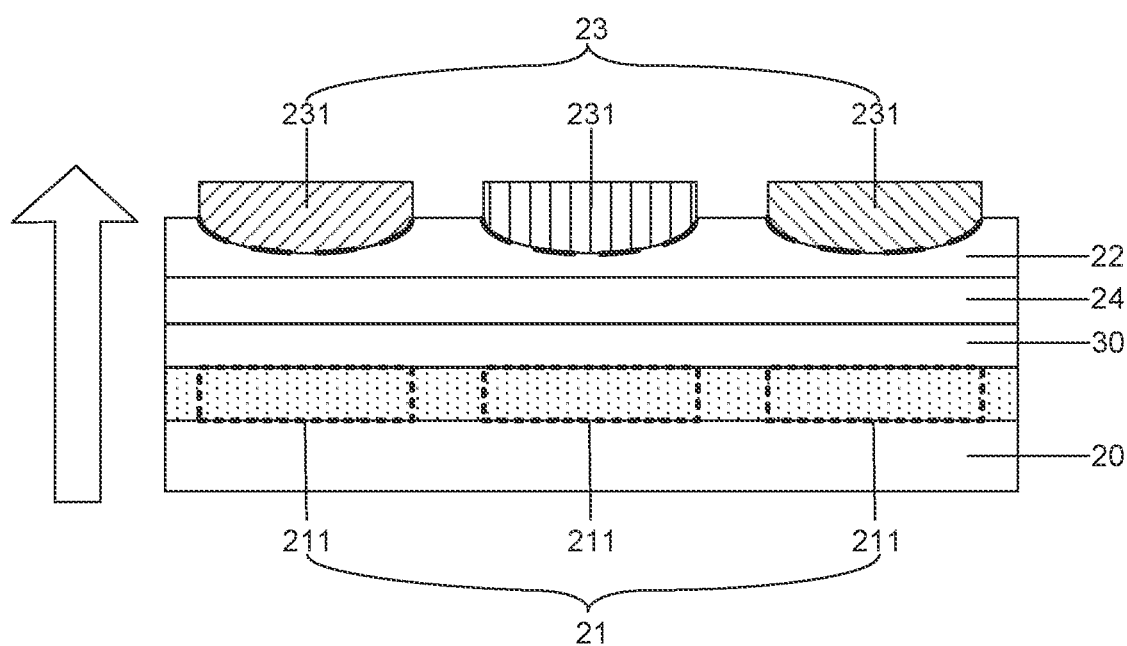
FIG. 14 is a schematic structural diagram of yet another display apparatus, according to some embodiments of the present disclosure.
Figure 15:
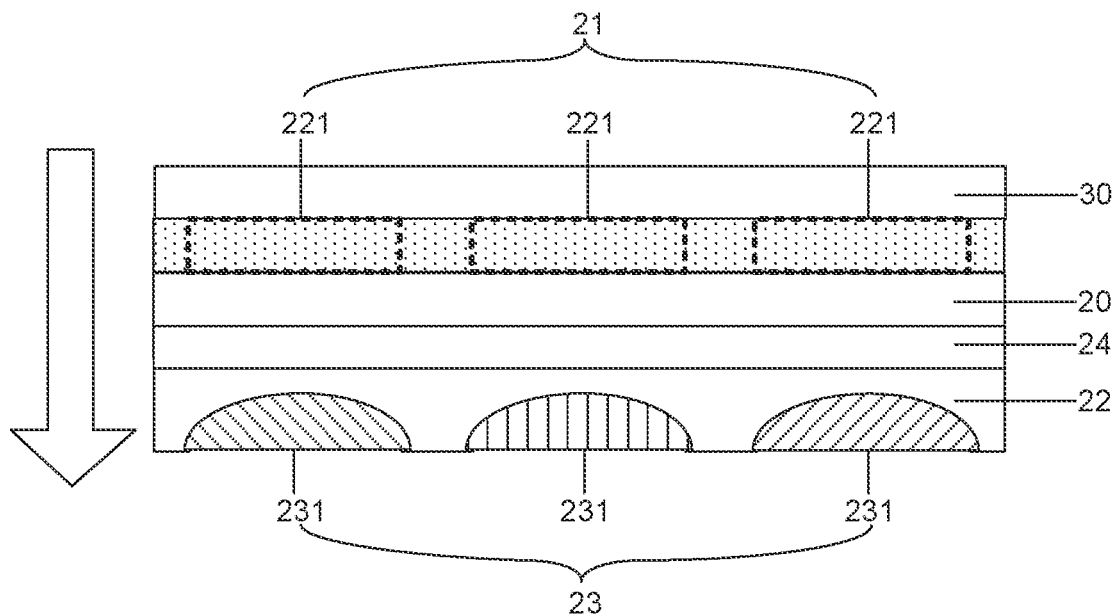
FIG. 15 is a schematic structural diagram of yet another display apparatus, according to some embodiments of the present disclosure.

Optionally, the color filter layer 23 is disposed outside the display panel. Depending on different light exit directions of the display layer 21, the color filter layer 23 is disposed at a side of the opposite substrate 30 away from the array substrate (as shown in FIG. 14, a direction indicated by the arrow is the light exit direction of the display layer 21), or is disposed on a side of the array substrate away from the opposite substrate 30 (as shown in FIG. 15, a direction indicated by the arrow is the light exit direction of the display layer 21). In a case where the color filter layer 23 is disposed outside the display panel, the color filter layer 23 may also be covered by a cover plate to protect the color filter layer 23.

Figure 11:
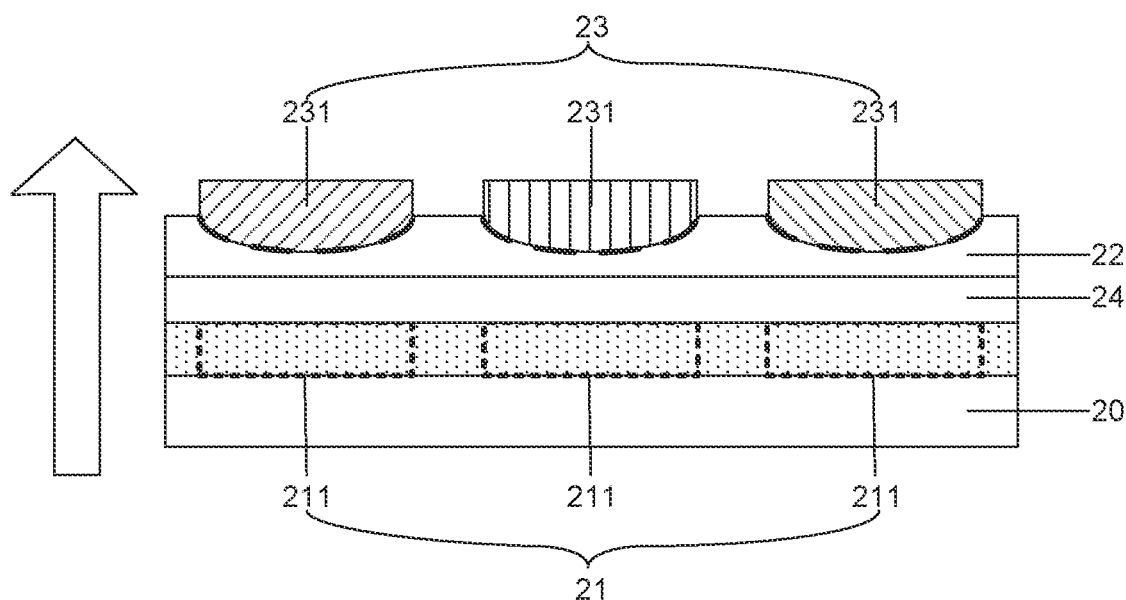
FIG. 11 is a schematic structural diagram of yet another display apparatus, according to some embodiments of the present disclosure.
Figure 12:
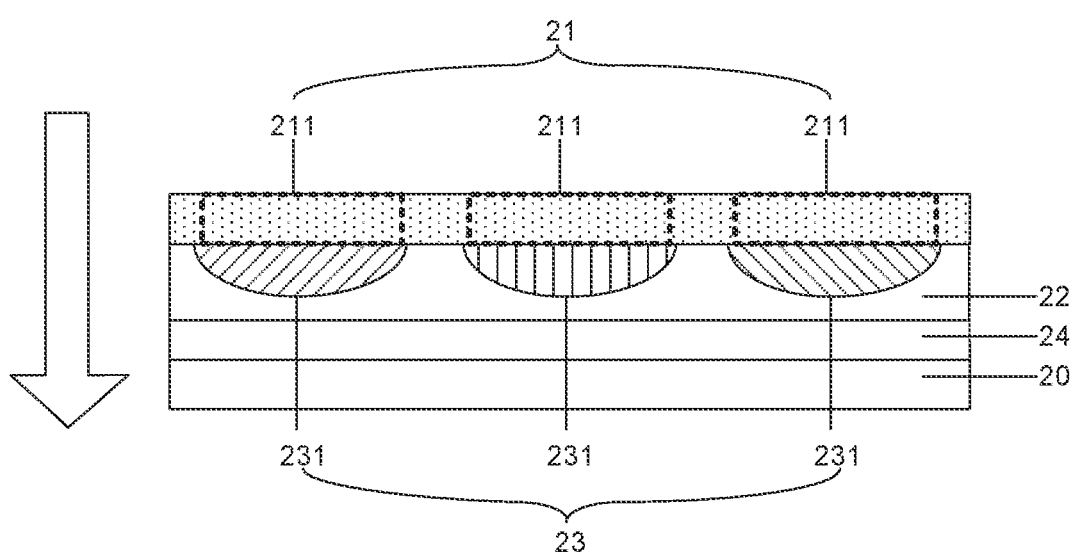
FIG. 12 is a schematic structural diagram of yet another display apparatus, according to some embodiments of the present disclosure.
Figure 13:
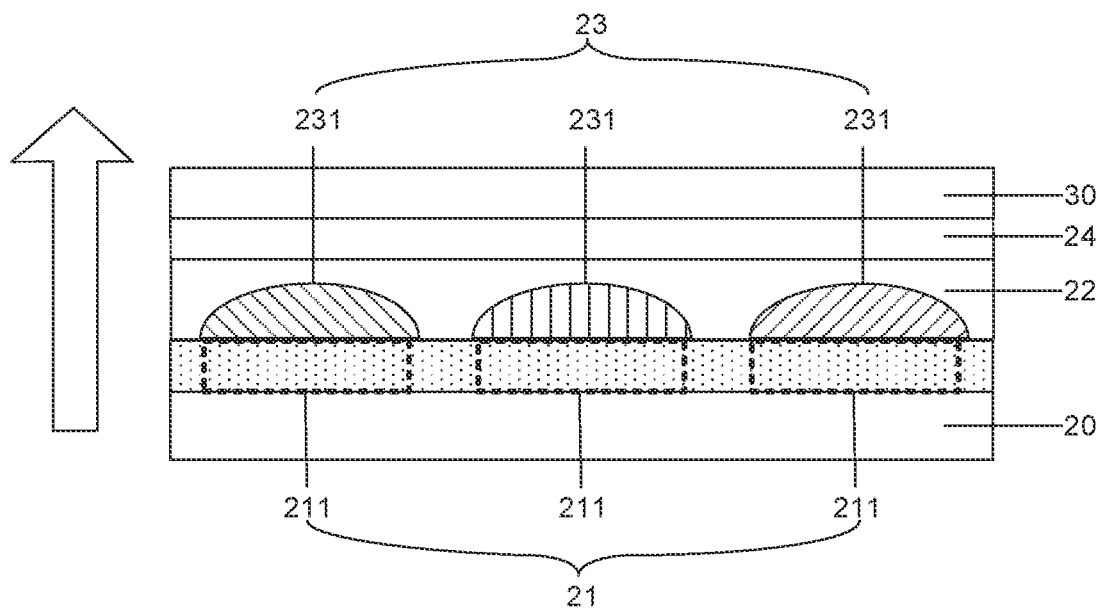
FIG. 13 is a schematic structural diagram of yet another display apparatus, according to some embodiments of the present disclosure.

On this basis, in a case where the color filter layer 23 is disposed in the array substrate or on the side of the array substrate away from the opposite substrate 30, a base on which the color filter layer 23 is provided and a base on which the display layer 21 is provided may be a same base 20 (as shown in FIG. 11, FIG. 12 or FIG. 15).

Figure 6:
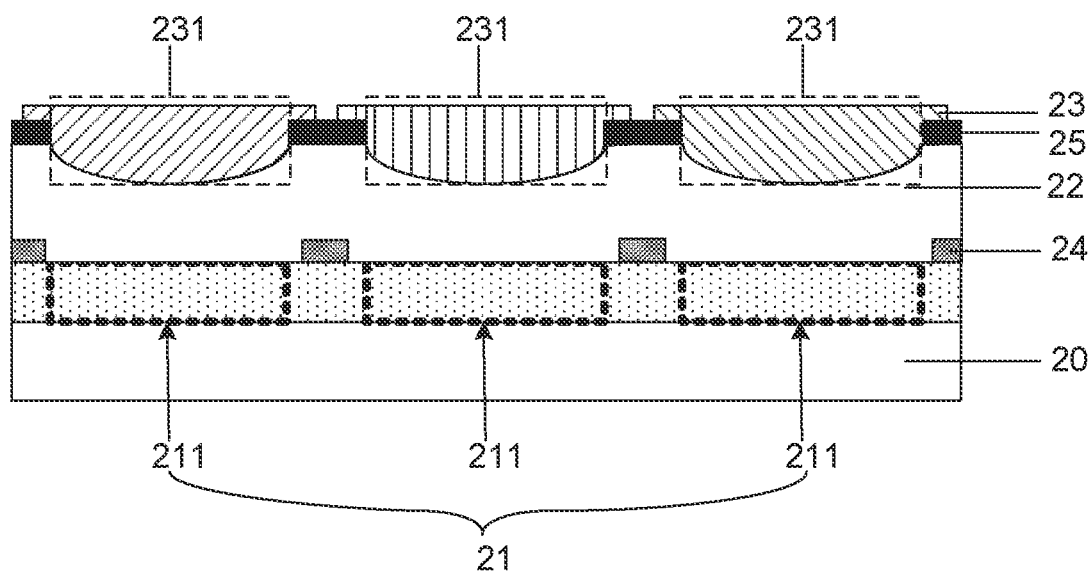
FIG. 6 is a schematic structural diagram of yet another display apparatus, according to some embodiments of the present disclosure.

It will be understood that, a portion of the color filter layer 23 configured to filter light emitted from a sub-pixel 211 is referred to as a color resistance portion 231. It will be noted here that, the color resistance portion 231 in some embodiments of the present disclosure is a portion of the color filter layer 23 that is capable of effectively transmitting light. For example, as shown in FIG. 6, a black matrix 25 is further disposed among adjacent color resistance portions 231, and the light emitted from the sub-pixels 211 cannot pass through the black matrix 25 and thus cannot reach the color filter layer 23. Therefore, a portion of the color filter layer 23, a projection of which on the display layer 21 overlaps with a projection of the black matrix 25 on the display layer 21, is not used as a color resistance portion 231. That is, the color resistance portion is a portion located within a range of a dotted box marked as 231 shown in FIG. 6.

In some embodiments, a color of the light emitted from any sub-pixel 211 is the same as a color of a color resistance portion 231 corresponding to the sub-pixel. For example, each pixel unit in the display apparatus is consist of a sub-pixel 211 emitting red light, a sub-pixel 211 emitting green light, and a sub-pixel 211 emitting blue light. A color resistance portion 231 disposed at a light exit side of the sub-pixel 211 emitting the red light is a red color resistance portion 231 that allows a transmission of the red light. Similarly, a color resistance portion 231 disposed at a light exit side of the sub-pixel 211 emitting the green light is a green color resistance portion 231 that allows a transmission of the green light. A color resistance portion 231 disposed at a light exit side of the sub-pixel 211 emitting the blue light is a blue color resistance portion 231 that allows a transmission of the blue light. In a case where each pixel unit further includes a sub-pixel 211 emitting white light, a color resistance portion 231 disposed on a light exit side of the sub-pixel 211 emitting the white light is a transparent color resistance portion 231. That is, the transparent color resistance portion 231 is capable of allowing a transmission of the white light formed by mixing a plurality of kinds of light.

It is worth mentioning that, in some embodiments, a color of the light emitted from each sub-pixel 211 is white, and color resistance portions 231 corresponding to different sub-pixels 211 are red color resistance portions, green color resistance portions and blue color resistance portions, thereby achieving a color display of the display apparatus through filtering effects of the colored color resistance portions.

The above description that a thickness of any color resistance portion 231 is decreased in a direction away from a reference line of the color resistance portion 231, means that thicknesses of portions in a color resistance portion 231 are different, and as for any two portions of the color resistance portion 231 that have different distances from the reference line in a direction perpendicular to the reference line, a thickness of a portion more proximate to the reference line is not less than a thickness of a portion farther away from the reference line. Here, the thickness of the color resistance portion 231 is a thickness of the color resistance portion 231 in a direction perpendicular to the display layer 21.

Some embodiments of the present disclosure do not limit a manner in which the thickness of each color resistance portion 231 is changed. For example, the thickness of the color resistance portion 231 is gradually changed or is stepwise changed, as long as the thickness of the color resistance portion 231 is decreased in the direction away from the reference line.

Figure 4A:
FIG. 4a is a cross-sectional diagram of a color resistance portion, according to some embodiments of the present disclosure.

For example, as shown in FIG. 4a, as for any two portions of the color resistance portion 231 that have different distances from the reference line in a direction perpendicular to the reference line, the thickness of the portion more proximate to the reference line is always greater than the thickness of the portion farther away from the reference line.

Figure 4B:
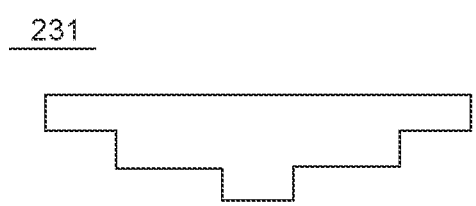
FIG. 4b is a cross-sectional diagram of another color resistance portion, according to some embodiments of the present disclosure.

Or, as shown in FIG. 4b, as for any two portions of the color resistance portion 231 that have different distances from the reference line in a direction perpendicular to the reference line, the thickness of the portion more proximate to the reference line may be greater than or equal to the thickness of the portion farther away from the reference line, as long as an overall thickness of the color resistance portion 231 is decreased in the direction away from the reference line.

Some embodiments of the present disclosure do not limit the thicknesses of the portions of the color resistance portion 231, which are related to distances actually traveled in the color resistance portion 231 by light beams of angles emitted from a sub-pixel 211. In some embodiments of the present disclosure, the thicknesses of portions of a color resistance portion 231 are thicknesses of portions of the color resistance portion 231 that are set when distances actually traveled in the color resistance portion 231 by light beams of a same angle or different angles emitted from a single sub-pixel 211 are the same.

On a basis of achieving filtering, a thickness of the color filter layer 23 may be as thin as possible. For example, the thickness of the color filter layer 23 may be 2 µm to 10 µm, thereby facilitating to achieve thinning of the display apparatus.

In the display apparatus provided by some embodiments of the present disclosure, by arranging the color filter layer 23 on the display side of the display layer 21, the ambient light entering the display apparatus from the display side thereof reaches the inside of the display apparatus through the color filter layer 23. In a case where the color resistance portions 231 in the color filter layer 23 include the colored resistance portions such as the red color resistance portions, the green color resistance portions, and the blue resistance portions, most of the ambient light other than the same color as the corresponding color resist portion 231 may be filtered. In a case where the color resistance portions 231 in the color filter layer 23 include transparent color resistance portions, since the transparent color resistance portions themselves have a certain light transmittance, a portion of the ambient light may also be filtered out. After the ambient light is filtered by the color filter layer 23, a small amount of the ambient light entering the display apparatus is reflected by metal layers or the like inside the display panel, and a portion of the ambient light is lost. When the ambient light exits through the color filter layer 23 after being reflected, the reflected light is filtered again by the color filter layer 23, which further reduces an intensity of the exiting reflected light, so that the intensity of the exiting reflected light is very small, thereby reducing an influence of the reflection of the ambient light on a display effect. Since the thickness of the color filter layer 23 (for example, 5 µm) is much smaller than the thickness of the circular polarizer (usually approximately 100 µm), arranging the color filter layer 23 on the display side of the display layer 21 may not only reduce the reflection of the ambient light, but also reduce a thickness of the display apparatus, which is advantageous for achieving the thin design of the display apparatus. In addition, the color filter layer 23 may also increase a color purity of light exiting from the display layer 21 through a filter effect of the color filter layer 23.

On this basis, since light beams of large angles emitted from any sub-pixel 211 always tilt toward a sub-pixel 211 adjacent to the sub-pixel 211, the thickness of the portion of the color resistance portion 231 farther away from the reference line are set to be smaller, which may reduce distances actually traveled in a corresponding color resistance portion 231 by the light beams of large angles emitted from the sub-pixel 211, thereby reducing a difference in the distances actually traveled in the color resistance portion 231 by the light beams of respective angles emitted from the sub-pixel 211, and reducing a difference in color purities of the light beams of respective angles emitted from the color resistance portion 231, and further improving a problem that color purities of an image from different viewing angles are different, and improving the display effect of the display apparatus.

Some embodiments of the present disclosure do not limit relative sizes of a color resistance portion 231 and its corresponding sub-pixel 211. An orthographic projection of each sub-pixel 211 on the base 20 is located within a range of an orthographic projection of a corresponding color resistance portion 231 on the base 20, or slightly exceeds the range of the orthographic projection of the corresponding color resistance portion 231 on the base 20.

It will be worth mentioning that, in a case where the orthographic projection of each sub-pixel 211 on the base 20 slightly exceeds the range of the orthographic projection of the corresponding color resistance portion 231 on the base 20, due to a presence of the pixel defining layer or signal wires in the display apparatus, or due to a light-shielding effect of the black matrix provided in the display apparatus, there is generally no problem of light leakage.

Figure 3:
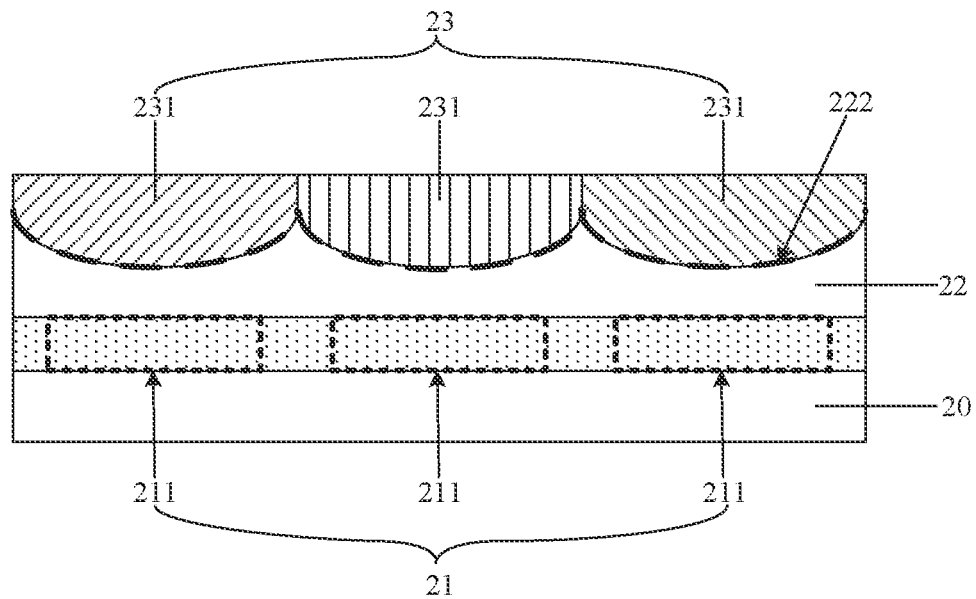
FIG. 3 is a schematic structural diagram of another display apparatus, according to some embodiments of the present disclosure.

As shown in FIG. 3, in some embodiments, the orthographic projection of each sub-pixel 211 on the base 20 is located within the range of the orthographic projection of the corresponding color resistance portion 231 on the base 20. That is, a border of an orthographic projection of a color resistance portion 231 on the base 20 exceeds a border of an orthographic projection of a corresponding sub-pixel 211 on the base 20. Or, the orthographic projection of the color resistance portion 231 on the base 20 exactly overlaps with the orthographic projection of the corresponding sub-pixel 211 on the base 20.

Here, a size of a portion of an edge of a color resistance portion 231, an orthographic projection of which on the base 20 exceeds an edge of an orthographic projection of a corresponding sub-pixel 211 on the base 20, is related to a specific process and a specific structure of the display apparatus, which is not limited here. For example, an edge of an orthographic projection of a color resistance portion 231 exceeds an edge of a sub-pixel 211 covered by the orthographic projection of the color resistance portion 231 by 2 μm to 10 μm.

Since the light beams of large angles emitted from a sub-pixel 211 have large exit angles, in some embodiments of the present disclosure, a border of an orthographic projection of a resistance portion 231 on the base 20 is set to exceed a border of an orthographic projection of a corresponding sub-pixel 211 on the base 20, the light beams of large angles emitted from the sub-pixel 211 may be fully utilized. In this way, the light beams are fully used for display without being blocked, thereby increasing a luminance of the display apparatus at same power consumption.

In some embodiments, as shown in FIGS. 2 and 3, the display apparatus further includes a first insulating layer 22. A surface of the first insulating layer 22 adjacent to the color filter layer 23 is provided with a plurality of first grooves 222 in one-to-one correspondence with the plurality of color resistance portions 231. A depth of any first groove 222 is decreased in a direction away from the reference line of a corresponding color resistance portion 231. An orthographic projection of each color resistance portion 231 on the display layer 21 is located within a range of an orthographic projection of a corresponding first groove 222 on the display layer 21. A surface of each first groove 222 adjacent to the color filter layer 23 is in contact with a surface of the corresponding color resistance portion 231 adjacent to the first insulating layer 22.

That is, a portion of each color resistance portion 231 adjacent to the first insulating layer 22 is filled in the corresponding first groove 222. Moreover, as for the plurality of first grooves 222 and the plurality of color resistance portions 231 that are in one-to-one correspondence, a surface of each first groove 222 adjacent to a corresponding color resistance portion 231 is in direct contact with a surface of the color resistance portion 231 adjacent to the first groove 222. As a result, a thickness of each portion in each color resistance portion 231 corresponds to a depth of a corresponding portion in the corresponding first groove 222, so that a depth of each first groove 222 is decreased in the direction away from the reference line of the corresponding color resistance portion 231, thereby causing the thickness of the corresponding color resistance portion 231 formed in the first groove 222 to be decreased in the direction away from the reference line.

Here, due to a material and a formation process, a surface of the color filter layer 23 away from the first insulating layer 22 is flatter than a surface of the color filter layer 23 adjacent to the first insulating layer 22. That is, a degree of bending of the surface of the color resistance portion 231 adjacent to the first insulating layer 22 is greater than a degree of bending of a surface of the color resistance portion 231 away from the first insulating layer 22. Therefore, the thicknesses of the portions of each color resistance portion 231 filled in the corresponding first groove 222 are different, and in each color resistance portion 231, a thickness of a region proximate to the reference line is greater than a thickness of a region away from the reference line, thereby achieving that the thickness of each color resistance portion 231 is decreased in the direction away from the reference line.

In some embodiments of the present disclosure, according to a pattern of a first groove 222 in the first insulating layer 22, a pattern of the surface of a corresponding color resistance portion 231 adjacent to the first insulating layer 22 is formed, so that the thickness of the color resistance portion 231 is decreased in the direction away from the reference line, and a manufacturing method is simple. Moreover, in a case where the display layer 21 is in direct contact with the first insulating layer 22, the first insulating layer 22 may also protect the display layer 21.

Figure 5:
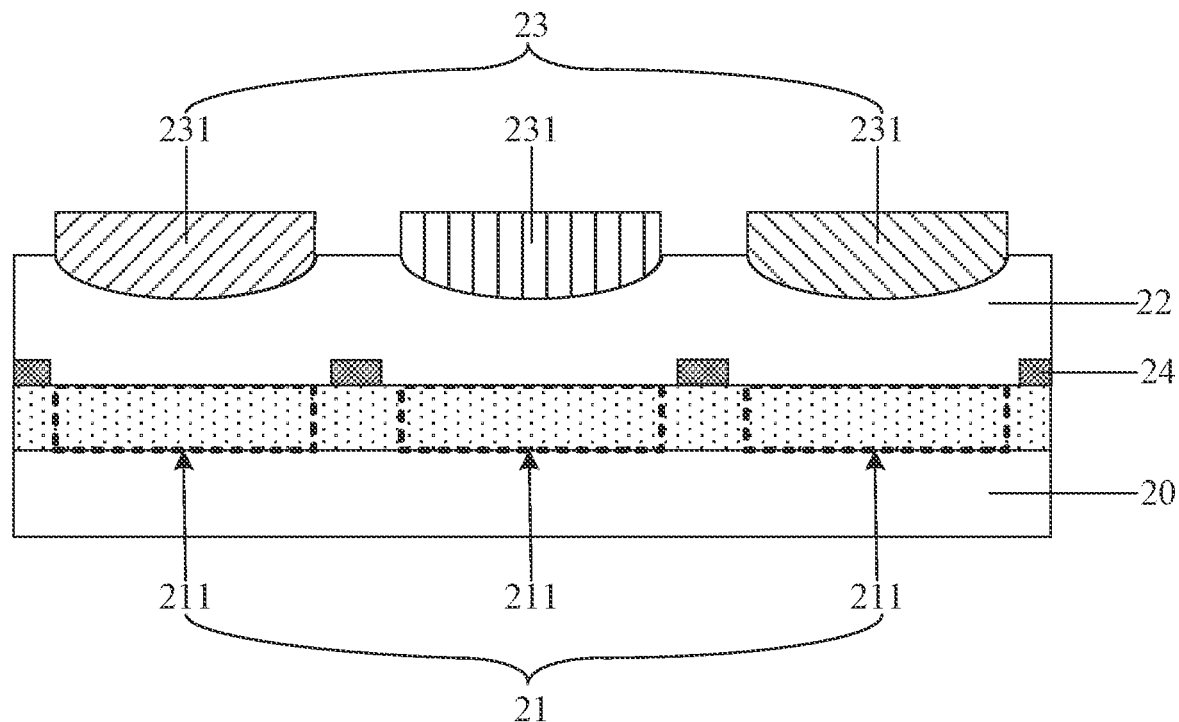
FIG. 5 is a schematic structural diagram of yet another display apparatus, according to some embodiments of the present disclosure.

In some embodiments, as shown in FIG. 5, the display apparatus further includes a touch structure layer 24 disposed on a side of the first insulating layer 22 away from the color filter layer 23.

Optionally, the touch structure layer 24 includes a plurality of electrodes.

Some embodiments of the present disclosure do not limit a material of the touch structure layer 24. For example, the material of the touch structure layer 24 may be metal or a transparent conductive material, such as indium tin oxide (ITO). Here, considering that a toughness of the metal material is greater than a toughness of the oxide conductive material, when the display apparatus is used as the flexible display apparatus, the metal material is used as the material of the touch structure layer 24 in the flexible display apparatus, which may prevent the touch structure layer 24 from being cracked when the flexible display apparatus is deformed.

Some embodiments of the present disclosure do not limit a position of the touch structure layer 24, and the position may be set according to the positions of the color filter layer 23 and the display layer 21 in the display apparatus. For example, the touch structure layer 24 is disposed in the array substrate of the display panel (as shown in FIG. 11, FIG. 12 or FIG. 15), or disposed on the opposite substrate 30 of the display panel (as shown in FIG. 13 or FIG. 14).

As shown in FIG. 6, the display apparatus further includes a black matrix 25 provided with a plurality of openings, and the plurality of color resistance portions 231 are in one-to-one correspondence with the plurality of openings. Orthographic projections of the plurality of electrodes of the touch structure layer 24 on the display layer 21 are located within a range of an orthographic projection of the black matrix 25 on the display layer 21, which may prevent an aperture ratio of the display apparatus from being affected in a case where the plurality of electrodes of the touch structure layer are made of an opaque material, such as the metal material. Moreover, the provided black matrix 25 may separate light beams with colors emitted from two adjacent sub-pixels 211 to avoid mixing the colors, and avoid the light leakage between two adjacent color resistance portions 231, thereby improving a color accuracy of the display panel. In addition, the black matrix 25 may also absorb the reflected light, which is from ambient light outside, between the two adjacent color resistance portions 231, which may avoid the influence of the reflection of the ambient light on the display effect of the display apparatus.

Some embodiments of the present disclosure do not limit the position of the touch structure layer 24. An orthographic projection of the touch structure layer 24 on the base 20 may overlap with the orthographic projections of sub-pixels 211 on the base 20, and may be located among orthographic projections of adjacent sub-pixels 211. In a case where the orthographic projection of the touch structure layer 24 on the base 20 overlaps with the orthographic projections of the sub-pixels 211 on the base 20, the material of the touch structure layer 24 is a transparent conductive material, such as the ITO.

Of course, in a case where the material of the touch structure layer 24 is the transparent conductive material, such as the ITO, the orthographic projection of the touch structure layer 24 on the base 20 may also be located within the range of the orthographic projection of the black matrix 25 on the base 20, which may prevent the light exiting from the display layer 21 being blocked due to a fact that the transparent conductive material has a certain transmittance.

Some embodiments of the present disclosure do not limit specific structures of the plurality of electrodes in the touch structure layer 24, and the plurality of touch electrodes may be disposed in a same layer or in different layers.

In some embodiments, an insulating layer is disposed on a side of the touch structure layer 24 to protect and insulate the touch structure layer 24. The insulating layer is, for example, the first insulating layer 22. On the one hand, the first insulating layer 22 may protect the touch structure layer 24 and prevent the touch structure layer 24 from being electrically connected to conductive structures in other layers. On the other hand, an additional insulating layer may not be required to be provided due to an effective use of the first insulating layer 22, which may further reduce the thickness of the display apparatus.

Figure 7:
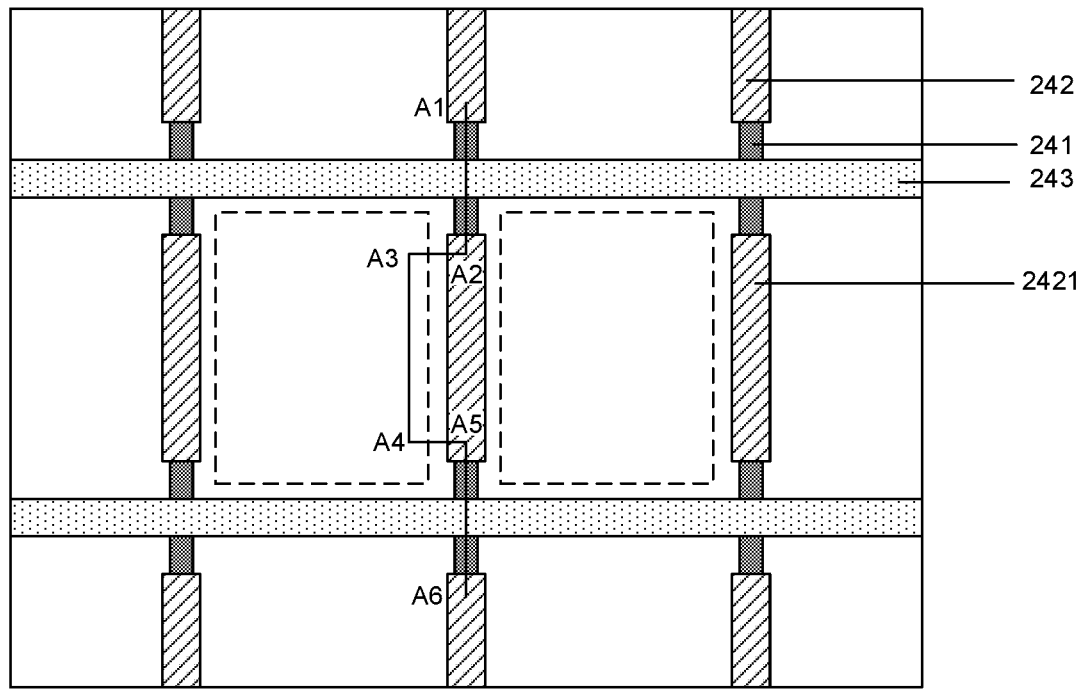
FIG. 7 is a schematic structural diagram of yet another display apparatus, according to some embodiments of the present disclosure.
Figure 8:
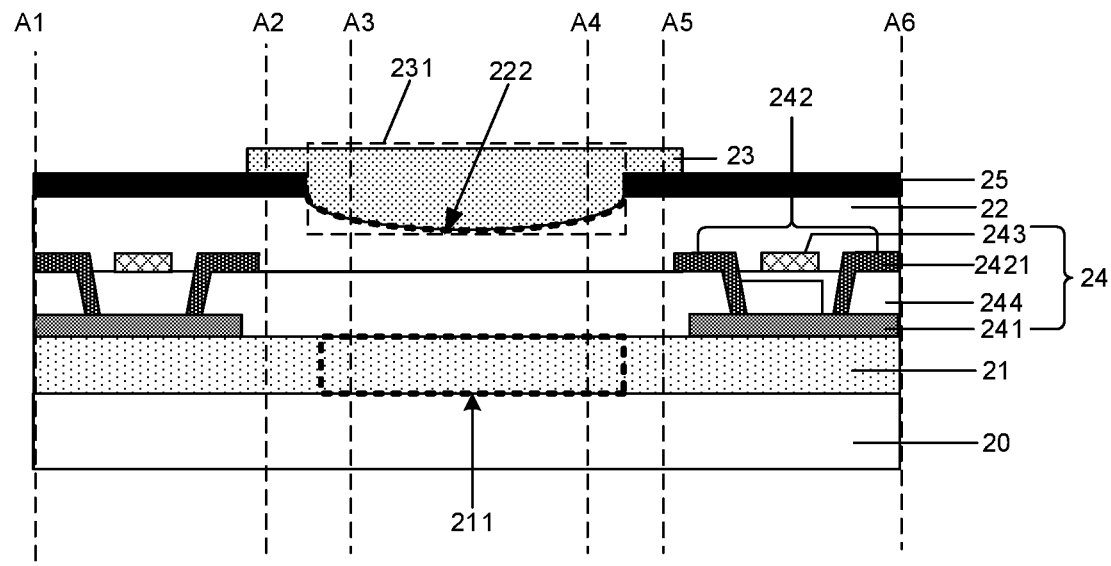
FIG. 8 is a cross-sectional diagram of the display apparatus shown in FIG. 7 along a broken line A1-A2-A3-A4-A5-A6.

In some embodiments, as shown in FIGS. 7 and 8, the plurality of electrodes of the touch structure layer 24 include first touch electrodes 242 and second touch electrodes 243. The first touch electrodes 242 and the second touch electrodes 243 are insulated from each other and arranged crosswise. Each first touch electrode 242 includes a plurality of first touch sub-electrodes 2421 separated by the second touch electrodes 243, and two adjacent first touch sub-electrodes 2421 in each first touch electrode 242 are electrically connected through a bridge 241. Bridges 241 and the second touch electrodes 243 are separated by a second insulating layer 244.

A thickness of each bridge 241, each first touch electrode 242 or each second touch electrode 243 is small, which is generally 0.2 μm to 0.5 μm. A thickness of the second insulating layer 244 is generally 1.5 μm to 3.5 μm.

It will be noted that, each bridge 241 may be the lower bridge shown in FIG. 8 (i.e., the bridge is disposed on a side of first touch sub-electrodes 2421 away from the first insulating layer 22), and may also be the upper bridge shown in FIG. 23b (i.e., the bridge is disposed on a side of first touch sub-electrode 2421 adjacent to the first insulating layer 22). Some embodiments of the present disclosure do not limit the arrangement manner of the bridge, which may be arranged by those skilled in the art according to actual needs.

The first touch electrodes 242 and the second touch electrodes 243 are disposed in the same layer or in different layers. The description that the first touch electrodes 242 and the second touch electrodes 243 are disposed in the same layer means that, the first touch electrodes 242 and the second touch electrodes 243 are synchronously manufactured. For example, an electrode layer is formed on a side of the second insulating layer 244 proximate to the first insulating layer 22, and the electrode layer is patterned to obtain the first touch electrodes 242 and the second touch electrodes 243.

Figure 9:
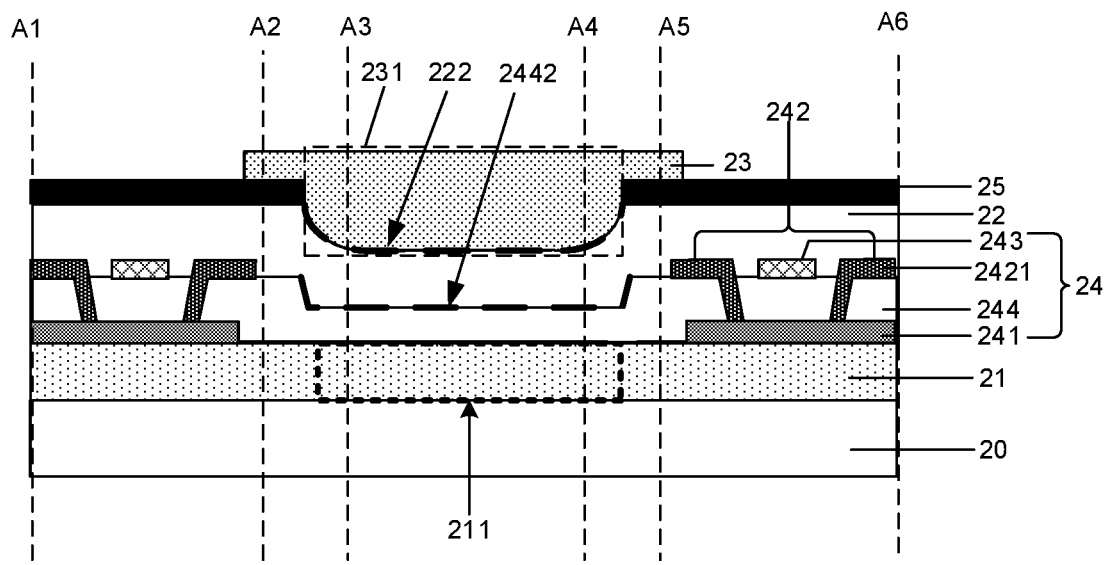
FIG. 9 is another cross-sectional diagram of the display apparatus shown in FIG. 7 along the broken line A1-A2-A3-A4-A5-A6.

As shown in FIG. 9, in some embodiments, a surface of the second insulating layer 244 adjacent to the first insulating layer 22 is provided with a plurality of second grooves 2442. The plurality of second grooves 2442 and the plurality of first grooves 222 are in one-to-one correspondence, and an orthographic projection of each first groove 222 on the display layer 21 is located within a range of an orthographic projection of a corresponding second groove 2442 on the display layer 21. A surface of each second groove 2442 adjacent to the first insulating layer is in contact with a surface of the first insulating layer 22 adjacent to the second insulating layer 244.

That is, a portion of the first insulating layer 22 adjacent to the second insulating layer 244 is filled in the second groove 2442. As for the plurality of first grooves 222 and the plurality of second grooves 2442 that are in one-to-one correspondence, a surface of each second groove 2242 adjacent to a corresponding first groove 222 is in direct contact with a surface of a portion of the first insulating layer 22 corresponding to the first groove 222 that is adjacent to the second groove 2442. As a result, a depth of each portion of each second groove 2442 corresponds to a depth of a corresponding portion of a corresponding first groove 222, so that the depth of each first groove 222 is decreased in the direction away from the reference line of the corresponding color resistance portion 231, thereby causing the thickness of the corresponding color resistance portion 231 formed in the first groove 222 to be decreased in the direction away from the reference line.

In a case where the depths of the plurality of first grooves 222 are deeper, an arrangement of the plurality of second grooves 2442 in one-to-one correspondence with the plurality of first grooves 222 may provide space for arranging first grooves 222 of a large depth, which facilitates to manufacture first grooves 222 of a desired depth. Moreover, a problem that a thickness of the first insulating layer is larger due to the deeper depths of the plurality of first grooves 222 is avoided, which is advantageous for reducing the thickness of the display apparatus.

Here, due to the material and the formation process, a surface of the first insulating layer 22 away from the second insulating layer 244 is flatter than the surface of the first insulating layer 22 adjacent to the second insulating layer 244. In addition, the color filter layer 23 also has a certain flattening effect during a formation process, and the degree of bending of the surface of the color resistance portion 231 adjacent to the first insulating layer 22 is greater than the degree of bending of the surface of the color resistance portion 231 away from the first insulating layer 22. Therefore, the thicknesses of the portions of the color resistance portion 231 filled in the corresponding first groove 222 are different, and in each color resistance portion 231, the thickness of the region proximate to the reference line is greater than the thickness of the region away from the reference line, thereby achieving that the thickness of the color resistance portion 231 is decreased in the direction away from the reference line.

Some embodiments of the present disclosure do not limit a specific shape of the second groove 2442, as long as the depth of each first groove 222 in the first insulating layer 22 disposed on a side of the second insulating layer 244 is decreased in the direction away from the reference line of the corresponding color resistance portion 231. For example, as shown in FIG. 9, a depth of each first groove 222 is gradually decreased in the direction away from the reference line of the corresponding color resistance portion 231; and accordingly, a depth of each second groove 2442 is also gradually decreased in the direction away from the reference line of the corresponding color resistance portion 231 with a corresponding first groove 222. Or, as shown in FIG. 10, a depth of a portion of the second groove 2442 proximate to the reference line of the corresponding color resistance portion 231 is substantially constant, and a depth of a portion of the second groove 2442 farther away from the reference line is significantly changed.

In some embodiments of the present disclosure, by using a shape of each second groove 2442 in the second insulating layer 244 of the touch structure layer 24, a corresponding first groove 222 is formed, so that the depth of the corresponding first groove 222 is decreased in the direction away from the reference line of the corresponding color resistance portion 231. In this way, the manufacturing method is simple and is advantageous for reducing the thickness of the display apparatus.

Figure 10:
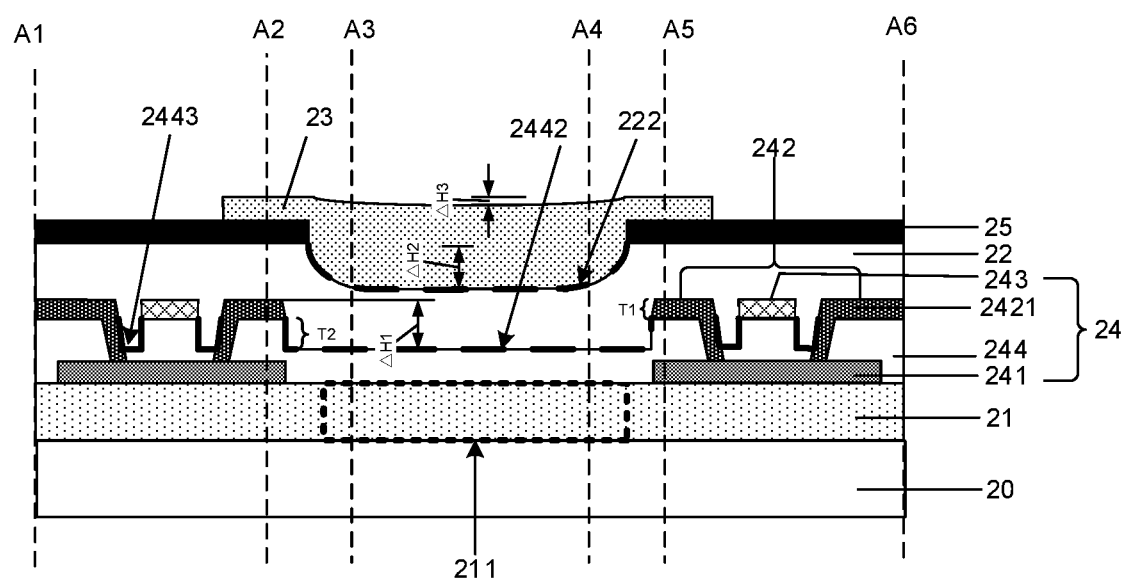
FIG. 10 is yet another cross-sectional diagram of the display apparatus shown in FIG. 7 along the broken line A1-A2-A3-A4-A5-A6.

In some embodiments, as shown in FIG. 10, the first touch electrodes 242 and the second touch electrodes 243 are disposed on a side of the bridges 241 proximate to the first insulating layer 22. The surface of the second insulating layer 244 adjacent to the first insulating layer 22 is provided with a plurality of third grooves, and an orthographic projection of each third groove 2443 on the display layer 21 is located between orthographic projections of a first touch sub-electrode 2421 and a second touch electrode 243 adjacent to the first touch sub-electrode 2421 on the display layer 21.

That is, in some embodiments of the present disclosure, in a case where the touch structure layer 24 has a lower bridge structure, in a process of manufacturing the lower bridge structure, the bridges 241 are formed first, then an insulating layer is formed on a side of the bridges 241, and finally the first touch electrodes 242 and the second touch electrodes 243 are formed in the same layer on a side of the insulating layer away from the bridges. Based on this, since a material for etching to form the first touch electrodes 242 (or the second touch electrodes 243) and a material for etching to form the second insulating layer 244 are different, when the second insulating layer 244 is manufactured, the first touch electrodes 242 and the second touch electrodes 243 disposed in the same layer may be used as a mask. In this way, the second insulating layer 244 provided with the second grooves 2442 and the third grooves 2443 may be formed by an etching process. Thus, a mask may be omitted, which may save manufacturing costs.

On this basis, as shown in FIG. 10, in some embodiments, each first touch electrode 242 and each second touch electrode 243 are disposed in the same layer and have a thickness T1, and a maximum depth of each second groove 2442 is T2. Thus, in the touch structure layer 24, a difference of a maximum thickness of a portion whose orthographic projection on the base 20 is located between the orthographic projections of the sub-pixels 211 on the base 20, and a minimum thickness of a portion whose orthographic projection on the base 20 overlaps with an orthographic projections of a sub-pixel 211 on the base 20 $\Delta H1$ is a sum of T1 and T2 ($\Delta H1=T1+T2$).

The first insulating layer 22 is disposed on a side of the touch structure layer 24 proximate to the color filter layer 23, and due to the material and the formation process, the surface of the first insulating layer 22 away from the second insulating layer 244 is flatter than the surface of the first insulating layer 22 adjacent to the second insulating layer 244. The touch structure layer 24 and the first insulating layer 22 are taken as a first combined structure. A difference of a maximum thickness of a portion of the first combined structure whose orthographic projection on the base 20 is located between the orthographic projections of the sub-pixels 211 on the base 20, and a minimum thickness of a portion of the first combined structure whose orthographic projection on the base 20 overlaps with an orthographic projection of a sub-pixel 211 on the base 20 $\Delta H2$ is less than $\Delta H1$ ($\Delta H2<\Delta H1$).

Finally, the color filter layer 23 is disposed on a side of the first insulating layer 22 away from the second insulating layer 244, and due to the material and the formation process, the surface of the color filter layer 23 away from the first insulating layer 22 is flatter than the surface of the color filter layer 23 adjacent to the first insulating layer 22. The touch structure layer 24, the first insulating layer 22 and the color filter layer 23 are taken as a second combined structure. A difference of a maximum thickness of a portion of the second combined structure whose orthographic projection on the base 20 is located between the orthographic projections of the sub-pixels 211 on the base 20, and a minimum thickness of a portion of the second combined structure whose orthographic projection on the display layer 21 overlaps with an orthographic projection of a sub-pixel 211 on the display layer 21 $\Delta H3$ is less than $\Delta H2$, and $\Delta H2$ is less than $\Delta H1$ ($\Delta H3<\Delta H2<\Delta H1$). As a result, the surface of the color filter layer 23 away from the first insulating layer 22 tends to be flat.

In some embodiments, the thickness of the color filter layer 23 is appropriately increased, and thus a flattening capability of the color filter layer 23 is improved. In this way, the surface of the color filter layer 23 away from the first insulating layer 22 is made flatter, so that $\Delta H3$ is negligible. Of course, a planarization layer may be provided on a side of the color filter layer 23 away from the first insulating layer 22.

In some embodiments, the first insulating layer 22 and the second insulating layer 244 each include an organic insulating layer to increase a toughness of the first insulating layer 22 and a toughness of the second insulating layer 244.

Since a toughness of an organic material is large, in some embodiments, when the display apparatus is used as the flexible display apparatus, the organic material is used as a material of the first insulating layer 22 and a material of the second insulating layer 244, which may prevent the first insulating layer 22 and the second insulating layer 244 from being cracked when the flexible display apparatus is deformed.

Figure 16:
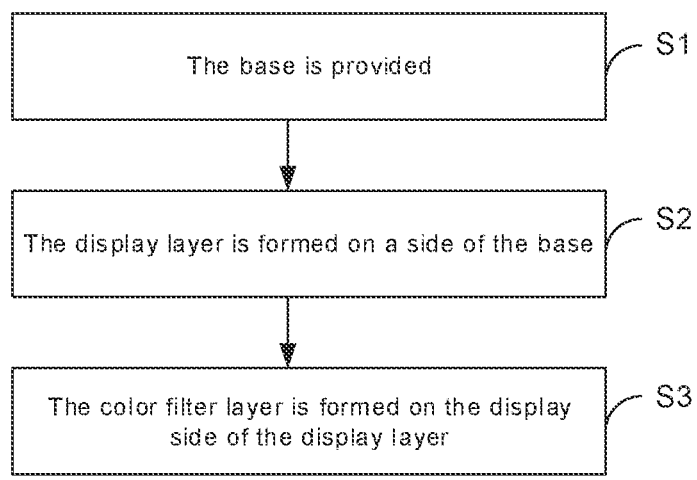
FIG. 16 is a flow diagram of a method of manufacturing a display apparatus, according to some embodiments of the present disclosure.

As shown in FIG. 16, some embodiments of the present disclosure further provide a method of manufacturing a display apparatus, and the method includes S1 to S3.

In S1, the base 20 is provided.

In S2, the display layer 21 is formed on a side of the base 20.

In S3, the color filter layer 23 is formed on the display side of the display layer 21.

As shown in FIG. 2, the display layer 21 formed includes the plurality of sub-pixels 211. The above display layer refers to the pixel structure layer that may achieve display. For example, the display apparatus is an OLED display panel, the display layer includes the OLED array, and each sub-pixel 211 corresponds to an OLED light-emitting device. Or, the display apparatus is a liquid crystal display panel, and the display layer includes the common electrode (s), the pixel electrodes in one-to-one correspondence with the plurality of sub-pixels, and the liquid crystal layer disposed between the common electrode(s) and the plurality of pixel electrodes. The display surface of the display layer refers to the surface of the display layer facing the viewer when the viewer faces the display apparatus and is able to view the image displayed.

The color filter layer 23 includes the plurality of color resistance portions 231 in one-to-one correspondence with the plurality of sub-pixels 211. The thickness of any color resistance portion is decreased in the direction away from the reference line of the color resistance portion, and the reference line is the straight line passing through the geometric center of the color resistance portion 231 and perpendicular to the base 20.

It will be noted that the display apparatus is, for example, a display panel or a display including a display panel, and the display panel is an OLED display panel or a liquid crystal display panel. Some embodiments of the present disclosure do not limit this, as long as the display apparatus may be used for display.

In the case where the display panel is an OLED display panel, the sub-pixels 211 included in the display layer 21 are defined by the pixel defining layer, and a range of the sub-pixel 211 is defined by a corresponding opening region of the pixel defining layer. In the case where the display panel is a liquid crystal display panel, the sub-pixels 211 included in the display layer 21 are defined by the gate lines and the data lines.

Some embodiments of the present disclosure do not limit the position of the color filter layer 23, and the color filter layer 23 may be disposed inside or outside the display panel, as long as the color filter layer 23 is located at the display side of the display layer 21.

Optionally, the color filter layer 23 is disposed inside the display panel. The color filter layer 23 is disposed in the array substrate of the display panel or on the opposite substrate 30 of the display panel (as shown in FIG. 13, the direction indicated by the arrow is the light exit direction of the display layer 21). The opposite substrate 30 is, for example, the substrate disposed opposite to the array substrate in the liquid crystal display panel. In the case where the color filter layer 23 is disposed in the array substrate of the display panel, depending on different display surfaces of the display panel (i.e., different light exit directions of the display layer 21), the color filter layer 23 is disposed, for example, on the side of the display layer 21 proximate to the base 20 (as shown in FIG. 12, the direction indicated by the arrow is the light exit direction of the display layer 21), or on the side of the display layer 21 away from the base 20 (as shown in FIG. 11, the direction indicated by the arrow is the light exit direction of the display layer 21).

Optionally, the color filter layer 23 is disposed outside the display panel. Depending on different light exit directions of the display layer 21, the color filter layer 23 is disposed at the side of the opposite substrate 30 away from the array substrate (as shown in FIG. 14, the direction indicated by the arrow is the light exit direction of the display layer 21), or is disposed on the side of the array substrate away from the opposite substrate 30 (as shown in FIG. 15, the direction indicated by the arrow is the light exit direction of the display layer 21). In the case where the color filter layer 23 is disposed outside the display panel, the color filter layer 23 may also be covered by the cover plate to protect the color filter layer 23.

On this basis, in the case where the color filter layer 23 is located in the array substrate or on the side of the array substrate away from the opposite substrate 30, the base on which the color filter layer 23 is provided and the base 20 on which the display layer 21 is provided may be the same base (as shown in FIG. 11, FIG. 12 or FIG. 15).

The display layer 21 is formed on the base 20, and the color filter layer 23 is formed on the display side of the display layer 21. An order in which the display layer 21 and the color filter layer 23 are formed is related to the light exit direction of the display layer 21 and the position of the color filter layer 23.

In some embodiments, as shown in FIG. 11, the light emitted from the display layer 21 exits along a direction pointing from the base 20 to the display layer 21, and the color filter layer 23 and the display layer 21 are located on a same side of the same base 20. In this case, the display layer 21 is first formed on the base 20, and then the color filter layer 23 is formed on the side of the display layer 21 away from the base 20.

In some embodiments, as shown in FIG. 13, the light emitted from the display layer 21 exits along a direction pointing from the base 20 to the opposite substrate 30, and the color filter layer 23 is located on the opposite substrate 30. In this case, the display layer 21 and the color filter layer 23 are not disposed on the same base. Therefore, the order in which the display layer 21 and the color filter layer 23 are formed is not limited.

In some embodiments, as shown in FIG. 14, the light emitted from the display layer 21 exits along a direction pointing from the base 20 to the opposite substrate 30, and the color filter layer 23 is located outside the display panel (a side of the opposite substrate 30 away from the base 20). In this case, the display layer 21 and the color filter layer 23 are not disposed on the same base. Therefore, the order in which the display layer 21 and the color filter layer 23 are formed is not limited.

In some embodiments, as shown in FIG. 12, the light emitted from the display layer 21 exits along a direction pointing from the display layer 21 to the base 20, and the color filter layer 23 and the display layer 21 are located on the same side of the same base 20. In this case, the color filter layer 23 is first formed on the base 20, and then the display layer 21 is formed on a side of the color filter layer 23 away from the base 20.

In some embodiments, the light emitted from the display layer 21 exits along a direction pointing from the opposite substrate 30 to the base 20, and the color filter layer 23 is located outside the display panel (a side of the base 20 away from the opposite substrate 30). In this case, the display layer 21 and the color filter layer 23 are not disposed on the same side of the same base 20 (as shown in FIG. 15), or the display layer 21 and the color filter layer 23 are not disposed on the same base (during manufacturing, the display layer 21 is disposed on the opposite substrate 30, and the color filter layer 23 is disposed on the side of the base 20 away from the opposite substrate 30). Therefore, the order in which the display layer 21 and the color filter layer 23 are formed is not limited.

It will be understood that, a portion of the color filter layer 23 configured to filter the light emitted from a sub-pixel 211 is referred to as a color resistance portion 231. It will be noted here that, the color resistance portion 231 in some embodiments of the present disclosure is a portion of the color filter layer 23 that is capable of effectively transmitting light. For example, as shown in FIG. 6, the black matrix 25 is further disposed among the adjacent color resistance portions 231, and the light emitted from the sub-pixels 211 cannot pass through the black matrix 25 and thus cannot reach the color filter layer 23. Therefore, the portion of the color filter layer 23, the projection of which on the display layer 21 overlaps with the projection of the black matrix 25 on the display layer 21, is not used as a color resistance portion 231.

The above description that the thickness of any color resistance portion 231 is decreased in the direction away from the reference line of the color resistance portion means that the thicknesses of the portions in a color resistance portion 231 are different, and as for any two portions of the color resistance portion 231 that have different distances from the reference line in a direction perpendicular to the reference line, the thickness of the portion more proximate to the reference line is not less than the thickness of the portion farther away from the reference line. Here, the thickness of the color resistance portion 231 is the thickness of the corresponding color resistance portion 231 in the direction perpendicular to the display layer 21.

Some embodiments of the present disclosure do not limit the manner in which the thickness of each color resistance portion 231 is changed. For example, the thickness of the color resistance portion 231 is gradually changed or is stepwise changed, as long as the thickness of the color resistance portion 231 is decreased in a direction away from the reference line.

For example, as shown in FIG. 4a, as for any two portions of the color resistance portion 231 that have different distances from the reference line in a direction perpendicular to the reference line, the thickness of the portion more proximate to the reference line is always greater than the thickness of the portion farther away from the reference line.

Or, as shown in FIG. 4b, as for any two portions of the color resistance portion 231 that have different distances from the reference line in a direction perpendicular to the reference line, the thickness of the portion more proximate to the reference line may be greater than or equal to the thickness of the portion farther away from the reference line, as long as the overall thickness of the color resistance portion 231 is decreased in the direction away from the reference line.

Some embodiments of the present disclosure do not limit the thicknesses of the portions of a color resistance portion 231, which are related to the distances actually traveled in the color resistance portion 231 by the light beams of the angles from a sub-pixel 211. In some embodiments of the present disclosure, the thicknesses of the portions of a color resistance portion 231 is are thicknesses of portions of the color resistance portion 231 that are set when the distances actually traveled in the color resistance portion 231 by the light beams of the same angle or different angles emitted from a single sub-pixel 211 are the same.

On the basis of achieving the filtering, the thickness of the color filter layer 23 may be as thin as possible. For example, the thickness of the color filter layer 23 may be 2 µm to 10 µm, thereby facilitating to achieve the thinning of the display apparatus.

The method of manufacturing the display apparatus provided by some embodiments of the present disclosure has same beneficial effects as the display apparatus in some embodiments described above, and details are not described herein again.

Some embodiments of the present disclosure do not limit the relative sizes of a color resistance portion 231 and its corresponding sub-pixel 211. The orthographic projection of each sub-pixel 211 on the base 20 is located within the range of the orthographic projection of a corresponding color resistance portion 231 on the base 20, or slightly exceeds the range of the orthographic projection of the corresponding color resistance portion 231 on the base 20.

It will be worth mentioning that, in the case where the orthographic projection of each sub-pixel 211 on the base 20 slightly exceeds the range of the orthographic projection of the corresponding color resistance portion 231 on the base 20, due to the presence of the pixel defining layer or the signal wires in the display apparatus, or due to the light-shielding effect of the black matrix provided in the display apparatus, there is generally no problem of light leakage.

In some embodiments, the orthographic projection of each sub-pixel 211 on the base 20 is located within the range of the orthographic projection of the corresponding color resistance portion 231 on the base 20. That is, the edge of the orthographic projection of a color resistance portion 231 on the base 20 exceeds the edge of the orthographic projection of the corresponding sub-pixel 211 on the base 20. Or, the orthographic projection of a color resistance portion 231 on the base 20 exactly overlaps with the orthographic projection of the corresponding sub-pixel 211 on the base 20.

Here, the size of the portion of an edge of a color resistance portion 231, an orthographic projection of which on the base 20 exceeds the edge of the orthographic projection of the corresponding sub-pixel 211 on the base 20, is related to the specific process and the specific structure of the display apparatus, which is not limited here. For example, the edge of the orthographic projection of a color resistance portion 231 exceeds the edge of the sub-pixel 211 covered by the orthographic projection of the color resistance portion 231 by 2 µm to 10 µm.

Since the light beams of large angle emitted from a sub-pixel 211 have large exit angles, in some embodiments of the present disclosure, the border of the orthographic projection of a color resistance portion 231 on the base 20 is set to exceed the border of the orthographic projection of the corresponding sub-pixel 211 on the base 20, which may fully utilize the light beams of large angles emitted from the sub-pixel 211. In this way, the light beams are fully used for display without being blocked, thereby increasing the luminance of the display apparatus at the same power consumption.

Figure 17:
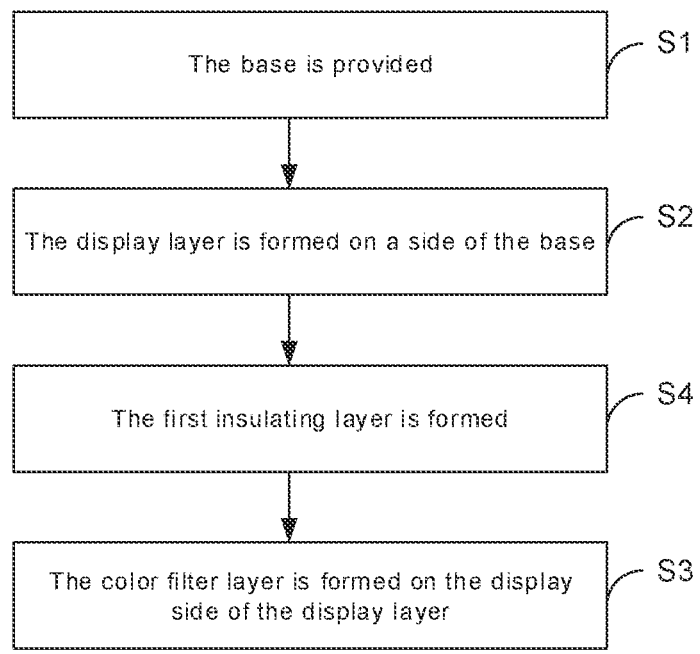
FIG. 17 is a flow diagram of another method of manufacturing a display apparatus, according to some embodiments of the present disclosure.

In some embodiments, as shown in FIG. 17, before the color filter layer 23 is formed, the method of manufacturing the display apparatus further includes S4.

In S4, the first insulating layer 22 is formed.

As shown in FIG. 2, the surface of the first insulating layer 22 adjacent to the color filter layer 23 is provided with the plurality of first grooves 222 in one-to-one correspondence with the plurality of color resistance portions 231. The depth of any first groove 222 is decreased in the direction away from the reference line of the corresponding color resistance portion 231. The orthographic projection of each color resistance portion 231 on the display layer 21 is located within the range of the orthographic projection of the corresponding first groove 222 on the display layer 21. The surface of each first groove 222 adjacent to the color filter layer 23 is in contact with the surface of the corresponding color resistance portion 231 adjacent to the first insulating layer 22.

That is, the portion of each color resistance portion 231 adjacent to the first insulating layer 22 is filled in the corresponding first groove 222. Moreover, as for the plurality of first grooves 222 and the plurality of color resistance portions 231 which are in one-to-one correspondence, the surface of each first groove 222 adjacent to the corresponding color resisting portion 231 is in direct contact with the surface of the color resistance portion 231 adjacent to the first groove 222. As a result, the thickness of each portion in each color resistance portion 231 corresponds to the depth of a corresponding portion in the corresponding first groove 222, so that the depth of each first groove 222 is decreased in the direction away from the reference line of the corresponding color resistance portion 231, thereby causing the thickness of the corresponding color resistance portion 231 formed in the first groove 222 to be decreased in the direction away from the reference line.

Here, due to the material and the formation process, the surface of the color filter layer 23 away from the first insulating layer 22 is flatter than the surface of the color filter layer 23 adjacent to the first insulating layer 22. That is, the degree of bending of the surface of the color resistance portion 231 adjacent to the first insulating layer 22 is greater than the degree of bending of the surface of the color resistance portion 231 away from the first insulating layer 22. Therefore, the thicknesses of the portions of each color resistance portion 231 filled in the corresponding first groove 222 are different, and in each color resistance portion 231, the thickness of the region proximate to the reference line is greater than the thickness of the region away from the reference line, thereby achieving that the thickness of each color resistance portion 231 is decreased in the direction away from the reference line.

In some embodiments of the present disclosure, according to the pattern of the first groove 222 in the first insulating layer 22, the pattern of the surface of a corresponding color resistance portion 231 adjacent to the first insulating layer 22 is formed, so that the thickness of the color resistance portion 231 is decreased in the direction away from the reference line, and the manufacturing method is simple. Moreover, in the case where the display layer 21 is in direct contact with the first insulating layer 22, the first insulating layer 22 may also protect the display layer 21.

Figure 18:
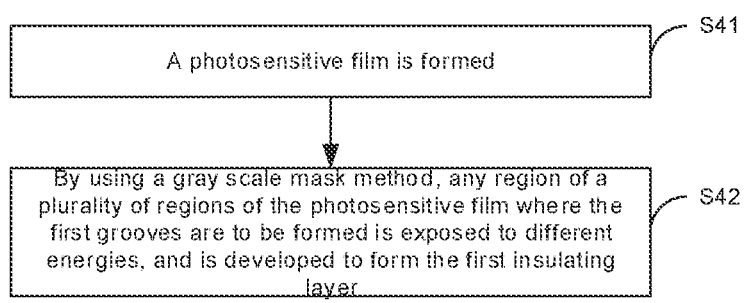
FIG. 18 is a flow diagram of manufacturing a first insulating layer, according to some embodiments of the present disclosure.

As shown in FIG. 18, in some embodiments, forming the first insulating layer 22, includes S41 and S42.

Figure 19A:
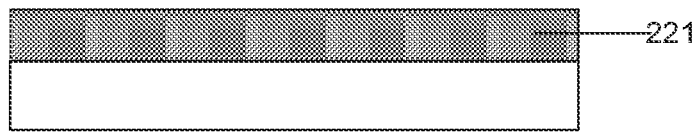
FIG. 19a and FIG. 19b are schematic diagrams showing the process of manufacturing the first insulating layer shown in FIG. 18.

In S41, as shown in FIG. 19a, a photosensitive film 221 is formed.

Figure 19B:
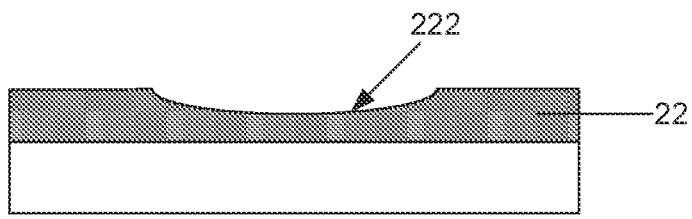

In S42, as shown in FIG. 19b, by using a gray scale mask method, any region of a plurality of regions of the photosensitive film 221 where the first grooves 222 are to be formed is exposed to different energies, and is developed to form the first insulating layer 22.

Here, as for any region of the plurality of regions of the photosensitive film 221 where the first grooves 222 are to be formed, portions of the region are exposed to different energies, and after the portions of the region are developed, thicknesses of retained portions are also different. Therefore, a desired shape of the first groove 222 may be formed.

In some embodiments of the present disclosure, a photosensitive material used in a process of forming the photosensitive film 221 is also an insulating material. Therefore, the photosensitive material is used to manufacture the first insulating layer 22, which may save the etching process, thereby simplifying a manufacturing process and saving the manufacturing costs.

In some embodiments, as shown in FIG. 26, the method of manufacturing the display apparatus further includes S5 and S6.

In S5, the black matrix having the plurality of openings 25 is formed. The plurality of color resistance portions 231 are in one-to-one correspondence with the plurality of openings.

In S6, before the first insulating layer 22 is formed, the touch structure layer 24 is formed on the side of the first insulating layer 22 away from the color filter layer 23, and an orthographic projection of the touch structure layer 24 on the display layer 21 is located within the range of the orthographic projection of the black matrix 25 on the display layer 21.

In some embodiments, forming the touch structure layer 24, includes: forming the second insulating layer 244, the bridges 241, the first touch electrodes 242, and the second touch electrodes 243.

The first touch electrodes 242 and the second touch electrodes 243 are insulated from each other and arranged crosswise. Each first touch electrode 242 includes the plurality of first touch sub-electrodes 2421 separated by the second touch electrodes 243, and the two adjacent first touch sub-electrodes 2421 in each first touch electrode 242 are electrically connected through a bridge 241. The bridges 241 and the second touch electrodes 243 are separated by the second insulating layer 244.

The thickness of each bridge 241, each first touch electrode 242 or each second touch electrode 243 is small, which is generally 0.2 μm to 0.5 μm. The thickness of the second insulating layer is generally 1.5 μm to 3.5 μm.

Optionally, the touch structure layer 24 includes the plurality of electrodes. Some embodiments of the present disclosure do not limit the material of the touch structure layer 24. For example, the material of the touch structure layer 24 may be metal, or the transparent conductive material, such as the ITO.

Here, considering that the toughness of the metal material is greater than the toughness of the oxide conductive material, when the display apparatus is used as the flexible display apparatus, the metal material is used as the material of the touch structure layer 24 in the flexible display apparatus, which may prevent the touch structure layer 24 from being cracked when the flexible display apparatus is deformed.

Each bridge 241 may be the lower bridge shown in FIG. 7 or FIG. 8 (i.e., the bridge is disposed on the side of first touch sub-electrodes 2421 away from the first insulating layer 22), and may also be the upper bridge shown in FIG. 23b (i.e., the bridge is disposed on the side of first touch sub-electrodes 2421 adjacent to the first insulating layer 22). Some embodiments of the present disclosure do not limit the arrangement manner of the bridge, which may be arranged by those skilled in the art according to the actual needs.

In some embodiments, the surface of the second insulating layer 244 proximate to the first insulating layer 22 is provided with the plurality of second grooves 2442. The plurality of second grooves 2442 are in one-to-one correspondence with the plurality of first grooves 222, and the orthographic projection of each first groove 222 on the display layer 21 is located within the range of the orthographic projection of the corresponding second groove 2442 on the display layer 21. The surface of each second groove 2442 adjacent to the first insulating layer is in contact with the surface of the first insulating layer 22 adjacent to the second insulating layer 244.

That is, the portion of the first insulating layer 22 adjacent to the second insulating layer 244 is filled in the second groove 2442. As for the plurality of first grooves 222 and the plurality of second grooves 2442 that are in one-to-one correspondence, the surface of each second groove 2242 adjacent to the corresponding first groove 222 is in direct contact with the surface of a portion of the first insulating layer 22 corresponding to the first groove 222 that is adjacent to the second groove 2442. As a result, the depth of each portion of each second groove 2442 corresponds to the depth of a corresponding portion of the corresponding first groove 222, so that the depth of each first groove 222 is decreased in the direction away from the reference line of the corresponding color resistance portion 231, thereby causing the thickness of the corresponding color resistance portion 231 formed in the first groove 222 to be decreased in the direction away from the reference line.

In the case where the depths of the plurality of first grooves 222 are deeper, the arrangement of the plurality of second grooves 2442 in one-to-one correspondence with the plurality of first grooves 222 may provide the space for arranging the first grooves 222 of the large depth, which facilitates to manufacture the first grooves 222 of the desired depth. Moreover, the problem that the thickness of the first insulating layer is larger due to the deeper depths of the plurality of first grooves 222 is avoided, which is advantageous for reducing the thickness of the display apparatus.

Here, due to the material and the formation process, the surface of the first insulating layer 22 away from the second insulating layer 244 is flatter than the surface of the first insulating layer 22 adjacent to the second insulating layer 244. In addition, the color filter layer 23 also has a certain flattening effect during the formation process, and the degree of bending of the surface of the color resistance portion 231 adjacent to the first insulating layer 22 is greater than the degree of bending of the surface of the color resistance portion 231 away from the first insulating layer 22. Therefore, the thicknesses of the portions of the color resistance portion 231 filled in the corresponding first groove 222 are different, and in each color resistance portion 231, the thickness of the region proximate to the reference line is greater than the thickness of the region away from the reference line, thereby achieving that the thickness of the color resistance portion 231 is decreased in the direction away from the reference line.

Some embodiments of the present disclosure do not limit the specific shape of the second groove 2442, as long as the depth of each first groove 222 in the first insulating layer 22 disposed on a side of the second insulating layer 244 is decreased in the direction away from the reference line of the corresponding color resistance portion 231. For example, as shown in FIG. 8, the depth of the second groove 2442 is gradually decreased in the direction away from the reference line of the corresponding color resistance portion 231. Or, as shown in FIG. 9, the depth of the portion of the second groove 2442 proximate to the reference line of the corresponding color resistance portion 231 is substantially constant, and the depth of the portion of each second groove 2442 farther away from the reference line is significantly changed.

In some embodiments, the touch structure layer 24 is formed by using a patterning process according to relative positions of the bridges 241, the first touch electrodes 242, and the second touch electrodes 243 (the lower bridge structure or an upper bridge structure, etc.).

Figure 20:
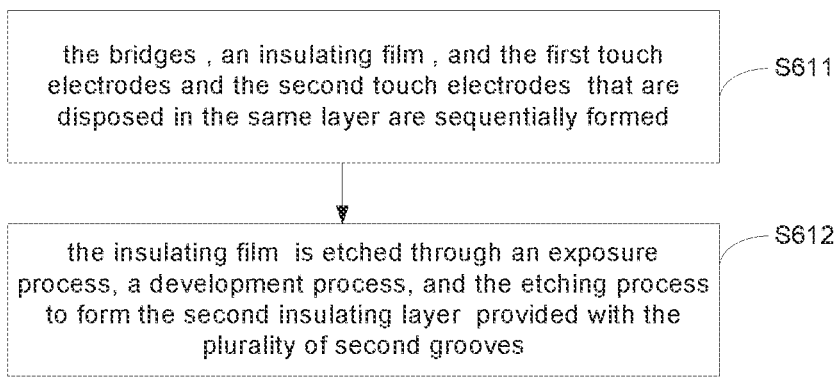
FIG. 20 is a flow diagram of manufacturing a touch structure layer, according to some embodiments of the present disclosure.

For example, the touch structure layer 24 has the lower bridge structure. As shown in FIG. 20, the touch structure layer 24 is manufactured through S611 and S612.

Figure 21A:
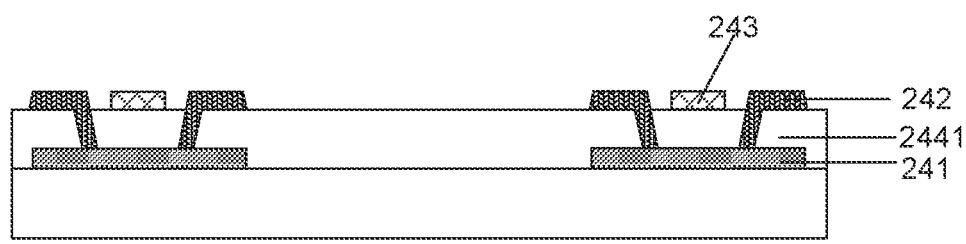

In S611, as shown in FIG. 21*a*, the bridges 241, an insulating film 2441, and the first touch electrodes 242 and the second touch electrodes 243 that are disposed in the same layer are sequentially formed.

As shown in FIG. 8, each first touch electrode 242 includes the plurality of first touch sub-electrodes 2421 separated by the second touch electrodes 243. The two adjacent first touch sub-electrodes 2421 of each first touch electrode 243 are electrically connected through a bridge 241. The two adjacent first touch sub-electrodes 2421 of each first touch electrode 243 are coupled to the bridge 241 through corresponding via holes which extend through the insulating film 2441.

In S612, as shown in FIG. 21*b*, the insulating film 2441 is etched through an exposure process, a development process, and the etching process to form the second insulating layer 244 provided with the plurality of second grooves 2442.

For example, the touch structure layer 24 has the upper bridge structure. As shown in FIG. 22, the touch structure layer 24 may be manufactured through S621 and S622.

In S621, as shown in FIG. 23*a*, the first touch electrodes 242 and the second touch electrodes 243 are formed in the same layer, and then the insulating film 2441 and the bridges 241 are sequentially formed.

Each first touch electrode 242 includes the plurality of first touch sub-electrodes 2421 separated by the second touch electrodes 243, and the two adjacent first touch sub-electrodes 2421 of each first touch electrode 243 are electrically connected through a bridge 241. The two adjacent first touch sub-electrodes 2421 of each first touch electrode 243 are coupled to the bridge 241 through corresponding via holes which extend through the insulating film 2441.

In S622, as shown in FIG. 23*b*, the insulating film 2441 is etched through the exposure process, the development process, and the etching process to form the second insulating layer 244 provided with the plurality of second grooves 2442.

As shown in FIG. 24, in some embodiments, forming the second insulating layer 244, the bridges 241, the first touch electrodes 242 and the second touch electrodes 243, includes S61 and S62.

In S61, as shown in FIG. 21*a*, the bridges 241, the insulating film 2441, and the first touch electrodes 242 and the second touch electrodes 243 that are disposed in the same layer are sequentially formed.

Optionally, the S61 includes: forming a first conductive layer, and patterning the first conductive layer to form the bridges 241; forming the insulating film 2441 on the first conductive layer, and forming a plurality of via holes in the insulating film 2441; and forming a second conductive layer on a side of the insulating film 2441 away from the first conductive layer, and patterning the second conductive layer to form the first touch sub-electrodes 2421 and the second touch electrodes, wherein the two adjacent first touch sub-electrodes 2421 of each first touch electrode 242 are coupled to a bridge 241 through the corresponding via holes.

In S62, as shown in FIG. 25, the first touch electrodes 242 and the second touch electrodes 243 are used as a mask to etch the surface of the insulating film 2441 away from the bridges 241 to form the second insulating layer 244 provided with the second grooves 2442 and the third grooves.

The orthographic projection of each third groove 2443 on the display layer 21 is located between the orthographic projection of a corresponding first touch sub-electrode 2421 on the display layer 21 and the orthographic projection of the second touch electrode 244 adjacent to the first touch sub-electrode 2421 on the display layer 21.

In some embodiments, since a material for etching to form the first touch electrodes 242 and the second touch electrodes 243 is different from the material for etching to form the second insulating layer 244, when the second insulating layer 244 is manufactured, the first touch electrodes 242 and the second touch electrodes 243 disposed in the same layer may be used as the mask, and the second insulating layer 244 provided with the second grooves 2442 and the third grooves is formed through an etching process. Thus, a mask may be omitted, which may save the manufacturing costs.

Of course, the insulating film 2441 may be directly etched by using a mask having a desired shape to form the second insulating layer 244 having the second grooves 2442. Thus, the second grooves 2442 may be etched at a desired position by using the shape of the mask, which facilitates to flexibly select an etching position according to actual needs.

In the description of the above embodiments, specific features, structures, materials or characteristics may be combined in an appropriate manner in any one or more embodiments or examples.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display apparatus, comprising:
a base;
a display layer disposed on a side of the base, the display layer including a plurality of sub-pixels;
a color filter layer disposed on a display side of the display layer, the color filter layer including a plurality of color resistance portions in one-to-one correspondence with the plurality of sub-pixels, wherein a thickness of any color resistance portion of the plurality of color resistance portions is decreased in a direction away from a reference line of the color resistance portion, and the reference line is a straight line passing through a geometric center of the color resistance portion and perpendicular to the base;
a first insulating layer, wherein a surface of the first insulating layer adjacent to the color filter layer is provided with a plurality of first grooves in one-to-one correspondence with the plurality of color resistance portions; and a depth of any first groove is decreased in a direction away from a reference line of a corresponding color resistance portion; and an orthographic projection of each color resistance portion on the display layer is located within a range of an orthographic projection of a corresponding first groove on the display layer; and a surface of each first groove adjacent to the color filter layer is in contact with a surface of a corresponding color resistance portion adjacent to the first insulating layer;
a touch structure layer disposed on a side of the first insulating layer away from the color filter layer; and
a black matrix provided with a plurality of openings, and the plurality of color resistance portions are in one-to-one correspondence with the plurality of openings;
wherein the touch structure layer includes a plurality of electrodes and a second insulating layer; orthographic projections of the plurality of electrodes of the touch structure layer on the display layer are located within a range of an orthographic projection of the black matrix on the display layer;
the plurality of electrodes include first touch electrodes, second touch electrodes, and bridges, the first touch electrodes and the second touch electrodes are insulated from each other and arranged crosswise; each first touch electrode includes a plurality of first touch sub-electrodes separated by the second touch electrodes, and two adjacent first touch sub-electrodes in the first touch electrode are electrically connected through a bridge; and the bridges and the second touch electrodes are separated by the second insulating layer;
a surface of the second insulating layer adjacent to the first insulating layer is provided with a plurality of second grooves; and the plurality of second grooves and the plurality of first grooves are in one-to-one correspondence, and an orthographic projection of each first groove on the display layer is located within a range of an orthographic projection of a corresponding second groove on the display layer, and a surface of each second groove adjacent to the first insulating layer is in direct contact with a surface of the first insulating layer adjacent to the second insulating layer;
the touch structure layer and the first insulating layer form a first combined structure, and the touch structure layer, the first insulating layer and the color filter layer form a second combined structure;
a difference of a maximum thickness of a portion of the first combined structure whose orthographic projection on the base is located between the orthographic projections of the sub-pixels on the base, and a minimum thickness of a portion of the first combined structure whose orthographic projection on the base overlaps with an orthographic projection of a sub-pixel on the base is ΔH2;
a difference of a maximum thickness of a portion of the second combined structure whose orthographic projection on the base is located between the orthographic projections of the sub-pixels on the base, and a minimum thickness of a portion of the second combined structure whose orthographic projection on the base overlaps with an orthographic projection of a sub-pixel on the base is ΔH3;
ΔH3 is less than ΔH2.

2. The display apparatus according to claim 1, wherein a difference of a maximum thickness of a portion of the touch structure layer whose orthographic projection on the base is located between the orthographic projections of the sub-pixels on the base, and a minimum thickness of a portion of the touch structure layer whose orthographic projection on the base overlaps with an orthographic projections of a sub-pixel on the base is ΔH1;
ΔH2 is less than ΔH1.

3. The display apparatus according to claim 1, wherein the thickness of any color resistance portion is stepwise changed.

4. The display apparatus according to claim 1, an edge of an orthographic projection of each color resistance portion on the base is located outside an edge of an orthographic projection of a corresponding opening on the base.

5. The display apparatus according to claim 4, wherein an orthographic projection of each sub-pixel on the base is located within a range of an orthographic projection of a corresponding color resistance portion on the base.

6. The display apparatus according to claim 5, an edge of the orthographic projection of each sub-pixel on the base is located inside the edge of the orthographic projection of the corresponding opening on the base.

7. The display apparatus according to claim 1, wherein a surface of the color filter layer away from the first insulating layer is flatter than a surface of the color filter layer adjacent to the first insulating layer.

8. The display apparatus according to claim 1, wherein a surface of the first insulating layer away from the second insulating layer is flatter than the surface of the first insulating layer adjacent to the second insulating layer.

9. The display apparatus according to claim 1, a thickness of the color filter layer is in a range of 2 μm to 10 μm.

10. The display apparatus according to claim 1, wherein the first touch electrodes and the second touch electrodes are disposed on a side of the bridges proximate to the first insulating layer; and the surface of the second insulating layer adjacent to the first insulating layer is further provided with a plurality of third grooves, an orthographic projection of each third groove on the display layer is located between an orthographic projection of a corresponding first touch sub-electrode on the display layer and an orthographic projection of a second touch electrode adjacent to the corresponding first touch sub-electrode on the display layer.

11. The display apparatus according to claim 1, wherein the first insulating layer and the second insulating layer each include an organic insulating layer.

12. The display apparatus according to claim 1, wherein a material of the touch structure layer is metal.

13. The display apparatus according to claim 1, wherein the first touch electrodes and the second touch electrodes are disposed in a same layer.

14. A method of manufacturing a display apparatus, the method comprising:
providing a base;
forming a display layer on a side of the base, the display layer including a plurality of sub-pixels;
forming a color filter layer on a display side of the display layer, the color filter layer including a plurality of color resistance portions in one-to-one correspondence with the plurality of sub-pixels, wherein a thickness of any color resistance portion is decreased in a direction away from a reference line of the color resistance portion, and the reference line is a straight line passing through a geometric center of the color resistance portion and perpendicular to the base;
before the color filter layer is formed, the method of manufacturing the display apparatus further comprises:
forming a first insulating layer, wherein a surface of the first insulating layer adjacent to the color filter layer is provided with a plurality of first grooves in one-to-one correspondence with the plurality of color resistance portions; a depth of any first groove is decreased in a direction away from a reference line of a corresponding color resistance portion; an orthographic projection of each color resistance portion on the display layer is located within a range of an orthographic projection of a corresponding first groove on the display layer; and a surface of each first groove adjacent to the color filter layer is in contact with a surface of the corresponding color resistance portion adjacent to the first insulating layer; and
forming a black matrix provided with a plurality of openings, wherein the plurality of color resistance portions being in one-to-one correspondence with the plurality of openings;
before forming the first insulating layer, the method of manufacturing the display apparatus further comprises:
forming a touch structure layer, wherein the touch structure layer includes a plurality of electrodes, and orthographic projections of the plurality of electrodes of the touch structure layer on the display layer are located within a range of an orthographic projection of the black matrix on the display layer;
wherein forming the touch structure layer, includes:
forming a second insulating layer, bridges, first touch electrodes, and second touch electrodes, wherein the first touch electrodes and the second touch electrodes are insulated from each other and are arranged crosswise; each first touch electrode includes a plurality of first touch sub-electrodes separated by the second touch electrodes, and two adjacent first touch sub-electrodes of each first touch electrode are electrically connected through a bridge; and the bridges and the second touch electrodes are separated by the second insulating layer; and a surface of the second insulating layer adjacent to the first insulating layer is provided with a plurality of second grooves; the plurality of second grooves and the plurality of first grooves are in one-to-one correspondence, and an orthographic projection of each first groove on the display layer is located within a range of an orthographic projection of a corresponding second groove on the display layer; and a surface of each second groove adjacent to the first insulating layer is in direct contact with a surface of the first insulating layer adjacent to the second insulating layer;

the touch structure layer and the first insulating layer form a first combined structure, and the touch structure layer, the first insulating layer and the color filter layer form a second combined structure;

a difference of a maximum thickness of a portion of the first combined structure whose orthographic projection on the base is located between the orthographic projections of the sub-pixels on the base, and a minimum thickness of a portion of the first combined structure whose orthographic projection on the base overlaps with an orthographic projection of a sub-pixel on the base is $\Delta H2$;

a difference of a maximum thickness of a portion of the second combined structure whose orthographic projection on the base is located between the orthographic projections of the sub-pixels on the base, and a minimum thickness of a portion of the second combined structure whose orthographic projection on the base overlaps with an orthographic projection of a sub-pixel on the base is $\Delta H3$;

$\Delta H3$ is less than $\Delta H2$.

15. The method of manufacturing the display apparatus according to claim 14, wherein forming the first insulating layer, includes:
forming a photosensitive film; and
exposing, by using a gray scale mask method, any region of a plurality of regions of the photosensitive film where the first grooves are to be formed at different exposure doses, and developing the exposed region to form the first insulating layer.

16. The method of manufacturing a display apparatus according to claim 14, wherein forming the second insulating layer, the bridges, the first touch electrodes, and the second touch electrodes, includes: sequentially forming the bridges, an insulating film, and the first touch electrodes and the second touch electrodes that are disposed in a same layer; and
etching a surface of the insulating film away from the bridges by using the first touch electrodes and the second touch electrodes as a mask to form the second insulating layer having the plurality of second grooves and a plurality of third grooves, wherein
an orthographic projection of each third groove on the display layer is located between an orthographic projection of a corresponding first touch sub-electrode on the display layer and an orthographic projection of a second touch electrode adjacent to the corresponding first touch sub-electrode on the display layer.

* * * * *